United States Patent
Lunev et al.

(10) Patent No.: US 9,312,448 B2
(45) Date of Patent: Apr. 12, 2016

(54) METALLIC CONTACT FOR OPTOELECTRONIC SEMICONDUCTOR DEVICE

(71) Applicant: Sensor Electronic Technology, Inc., Columbia, SC (US)

(72) Inventors: Alexander Lunev, Columbia, SC (US); Maxim S Shatalov, Columbia, SC (US); Alexander Dobrinsky, Providence, RI (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 13/940,515

(22) Filed: Jul. 12, 2013

(65) Prior Publication Data

US 2014/0016660 A1 Jan. 16, 2014

Related U.S. Application Data

(60) Provisional application No. 61/670,808, filed on Jul. 12, 2012.

(51) Int. Cl.
*H01L 33/38* (2010.01)
*H01L 33/36* (2010.01)
*H01L 33/60* (2010.01)
(Continued)

(52) U.S. Cl.
CPC .............. *H01L 33/387* (2013.01); *H01L 33/36* (2013.01); *H01L 33/38* (2013.01); *H01L 33/382* (2013.01); *H01L 33/40* (2013.01); *H01L 33/42* (2013.01); *H01L 33/60* (2013.01); *H01S 5/32* (2013.01); *H01L 33/405* (2013.01)

(58) Field of Classification Search
CPC ..... H01L 33/36; H01L 33/382; H01L 33/387; H01L 33/38; H01L 33/40; H01L 33/42
USPC ................ 257/79, 98, 99, E33.001, E33.062, 257/E33.063, E33.064, E33.065
See application file for complete search history.

(56) References Cited

U.S. PATENT DOCUMENTS 6,946,682 B2 * 9/2005 Slater et al. ..................... 257/79
7,601,993 B2 10/2009 Hoshi et al.
(Continued)

FOREIGN PATENT DOCUMENTS

KR 100786091 12/2007
KR 100826375 5/2008

OTHER PUBLICATIONS

Selvaraj et al., "AlN/AlGaN/GaN MIS-HEMTs with recessed source/drain Ohmic contact", physica status solidi, Jul. 2008, pp. 2988-2990, vol. 5, No. 9.
(Continued)

*Primary Examiner* — Eduardo A Rodela
(74) *Attorney, Agent, or Firm* — LaBatt, LLC

(57) ABSTRACT

A contact to a semiconductor layer in a light emitting structure is provided. The contact can include a plurality of contact areas formed of a metal and separated by a set of voids. The contact areas can be separated from one another by a characteristic distance selected based on a set of attributes of a semiconductor contact structure of the contact and a characteristic contact length scale of the contact. The voids can be configured to increase an overall reflectivity or transparency of the contact.

20 Claims, 15 Drawing Sheets

(51) Int. Cl.
*H01S 5/32* (2006.01)
*H01L 33/40* (2010.01)
*H01L 33/42* (2010.01)

(56) References Cited

U.S. PATENT DOCUMENTS

| | | | |
|---|---|---|---|
| 7,923,753 B2 | 4/2011 | Mita et al. | |
| 8,604,511 B2 * | 12/2013 | Bennett et al. | 257/103 |
| 2002/0142548 A1 | 10/2002 | Takaishi | |
| 2008/0258150 A1 | 10/2008 | McCarthy et al. | |
| 2009/0035884 A1 * | 2/2009 | Ikuta | 438/29 |
| 2009/0127575 A1 * | 5/2009 | Horng et al. | 257/98 |
| 2009/0212276 A1 | 8/2009 | Hong et al. | |
| 2010/0059781 A1 * | 3/2010 | Yokobayashi et al. | 257/98 |
| 2011/0018024 A1 * | 1/2011 | Fukshima et al. | 257/98 |
| 2011/0233596 A1 * | 9/2011 | Sano et al. | 257/98 |
| 2012/0049152 A1 * | 3/2012 | Schubert | 257/13 |
| 2012/0119189 A1 | 5/2012 | Gaska et al. | |
| 2013/0026519 A1 * | 1/2013 | Huang et al. | 257/98 |

OTHER PUBLICATIONS

Ahn et al., "30-nm recessed S/D SOI MOSFET with an ultrathin body and a low SDE resistance", IEEE Electron Device Letters, Jul. 2005, pp. 486-488, vol. 26, No. 7.

Zhang et al., "Self-Align Recessed Source Drain Ultrathin Body SOI MOSFET", IEEE Electron Device Letters, Nov. 2004, pp. 740-742, vol. 25, No. 11.

Ke et al., "Recessed source/drain for sub-50 nm UTB SOI MOSFET", Semiconductor Science and Technology, May 2007, pp. 577-583, vol. 22, No. 5.

Chen et al, "High-transconductance self-aligned AlGaN/GaN modulation-doped field-effect transistors with regrown ohmic contacts", Applied Physics Letters, 1998, pp. 3147-3149, vol. 73, No. 21.

Zopler et al., "Ion-implanted GaN junction field effect transistor", Applied Physics Letters, 1996, pp. 2273-2275, vol. 68, No. 16.

Song et al., "Ohmic-Contact Technology for GaN-Based Light-Emitting Diodes: Role of P-Type Contact", IEEE Trans. Electron Devices, Jan. 2010, pp. 42-59, vol. 57, No. 1.

Jang et al., "Low-resistance and thermally stable indium tin oxide Ohmic contacts on strained p-In[sub 0.15]Ga[sub 0.85]N/p-GaN layer", Journal of Applied Physics, 2007, pp. 013711, vol. 101, No. 1.

Huang et al., "Improvement of light output in GaN-based power chip light-emitting diodes with a nano-rough surface by nanoimprint lithography", Semicond. Sci. Technol., Apr. 2008, pp. 045022 (1-4 in copy provided), vol. 23, No. 4.

Lee et al., "Effects of strained InGaN interlayer on contact resistance between p-GaN and indium tin oxide", Applied Physics Letters, 2007, pp. 181125, vol. 90, No. 18.

Hong-Xia et al., "A Novel Ni/Ag/Pt Ohmic Contact to P-Type GaN for Flip-Chip Light-Emitting Diodes", Chinese Phys. Lett., Aug. 2006, pp. 2299-2302, vol. 23, No. 8.

Xie et al., "High reflectivity AlGaN/AlN DBR mirrors grown by MOCVD", Journal of Crystal Growth, Jan. 2007, pp. 691-694, vol. 298.

Wang et al., "Highly improved performance of a 350nm ultraviolet light-emitting diode containing AlxGa1-xN/AlyGa1-yN distributed Bragg reflectors", Journal of Crystal Growth, Jul. 2004, pp. 583-587, vol. 267, No. 3-4.

Schubert et al., "Distributed Bragg reflector consisting of high- and low-refractive-index thin film layers made of the same material", Applied Physics Letters, 2007, pp. 141115, vol. 90, No. 14.

Kim et al., "Enhanced light-extraction in GaInN near-ultraviolet light-emitting diode with Al-based omnidirectional reflector having NiZn/Ag microcontacts", Applied Physics Letters, 2006, pp. 141123, vol. 89, No. 14.

Sheu et al, "Enhancement in output power of blue gallium nitride-based light-emitting diodes with omnidirectional metal reflector under electrode pads", Applied Physics Letters, 2008, pp. 103507, vol. 93, No. 10.

Lin et al., "Enhancement of InGaNGaN Indium—Tin—Oxide Flip-Chip Light-Emitting Diodes With TiO_2-iO_2Multilayer Stack Omnidirectional Reflector", IEEE Photonics Technology Letters, Oct. 2006, pp. 2050-2052, vol. 18, No. 19.

Chiu et al., "Fabrication and characteristics of thin-film InGaN—GaN light-emitting diodes with TiO2/SiO2 omnidirectional reflectors", Semiconductor Science and Technology, Jul. 2007, pp. 831-835, vol. 22, No. 7.

Kim et al., "GaInN light-emitting diode with conductive omnidirectional reflector having a low-refractive-index indium—tin oxide layer", Applied Physics Letters, 2006, pp. 013501, vol. 88, No. 1.

Gessmann et al., "GaInN light-emitting diodes with omnidirectional reflectors", 2003, pp. 139-144, vol. 4996.

Kim et al., "GaInN light-emitting diodes with RuO2/SiO2/Ag omnidirectional reflector", Applied Physics Letters, 2004, pp. 4508-4510, vol. 84, No. 22.

Cheng et al., "GaN-Based LEDs With GaN <formula formulatype='inline'> <tes Notation='TeX'>\$\mu\$</tex></formula>-Pillars Around Mesa, Patterned Substrate, and Reflector Under Pads", Nov. 2009, IEEE Photonics Technology Letters, pp. 1659-1661, vol. 21, No. 22.

Huang et al., "High-Performance GaN-Based Vertical-Injection Light-Emitting Diodes With TiO2-SiO 2 Omnidirectional Reflector and n-GaN Roughness", IEEE Photonics Technology Letters, 2007, pp. 565-567, vol. 19, No. 8.

Gessmann, "High-efficiency AlGaInP light-emitting diodes for solid-state lighting applications", J. Appl. Phys., 2004, pp. 2203-2216, vol. 95, No. 5.

Yamada et al., "InGaN-Based Near-Ultraviolet and Blue-Light-Emitting Diodes with High External Quantum Efficiency Using a Patterned Sapphire Substrate and a Mesh Electrode", Dec. 2002, pp. L1431-L1433, vol. 41, No. Part 2, No. 12B.

Yan-Xu et al., "Flip-Chip GaN-Based Light-Emitting Diodes with Mesh-Contact Electrodes", Jan. 2007, pp. 268-270, vol. 24, No. 1.

Zhu et al., Enhanced output of GaN-based light-emitting diodes with stripe-contact electrodes, Applied Physics Letters, 2006, pp. 081127, vol. 89, No. 8.

Lee et al., "Enhanced Light Output of Vertical-Structured GaN-Based Light-Emitting Diodes with TiO2/SiO2 Reflector and Roughened GaOx Surface Film", Japanese Journal of Applied Physics, Apr. 2011, pp. 04DG06, vol. 50, No. 4.

Schubert et al., "Solid-state lighting-a benevolent technology", Rep. Prog. Phys., Dec. 2006, pp. 3069-3099, vol. 69, No. 12.

Park., International Search Report and Written Opinion for International Application No. PCT/US2013/050215, Sep. 26, 2013, 13 pages.

White, Notice of Allowance for U.S. Appl. No. 13/909,621, Oct. 8, 2014, 14 pages.

* cited by examiner

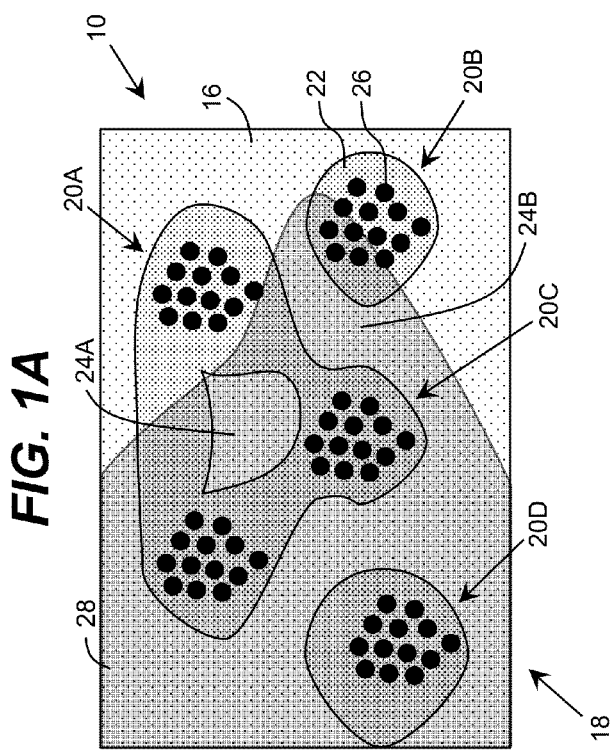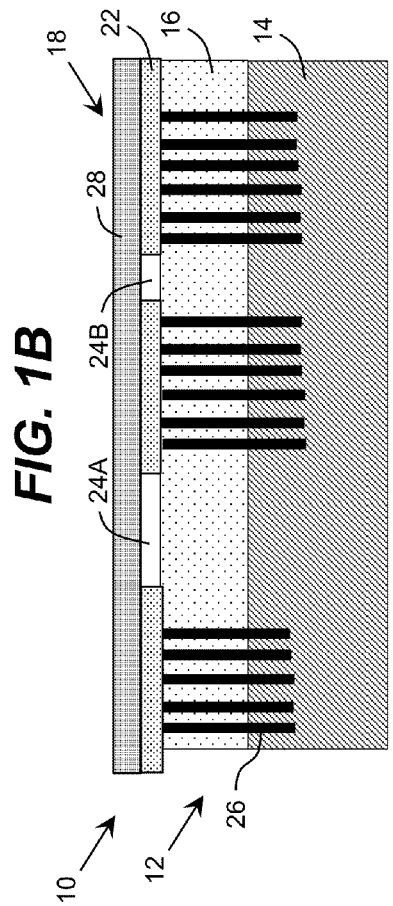

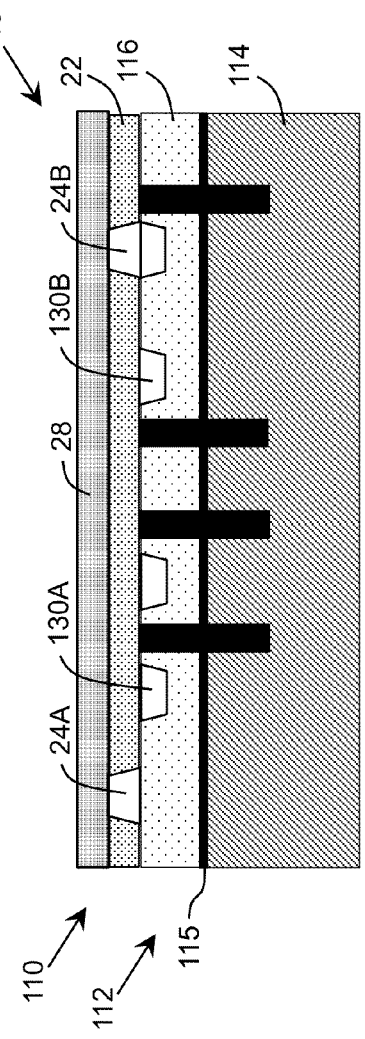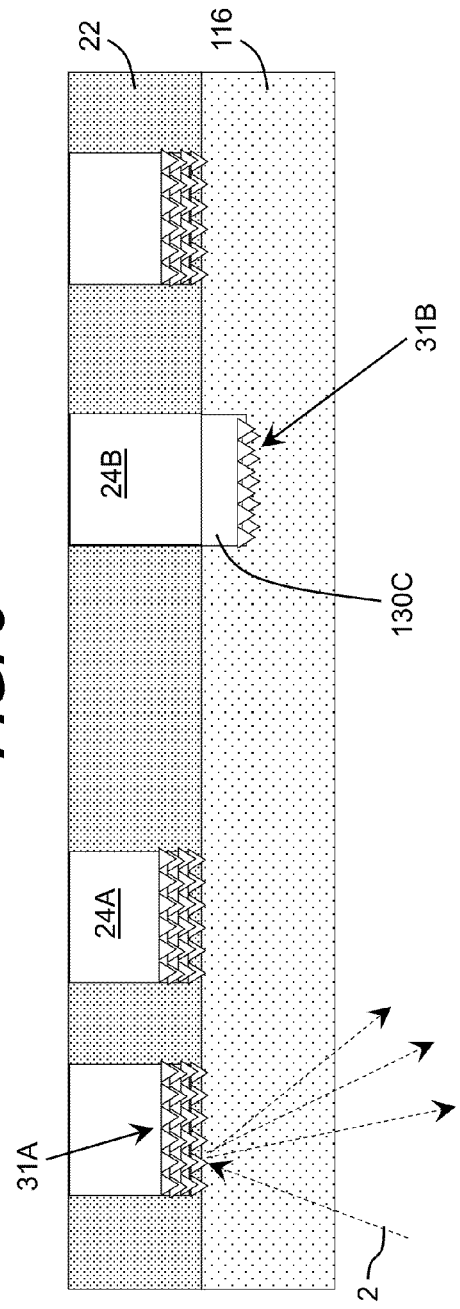

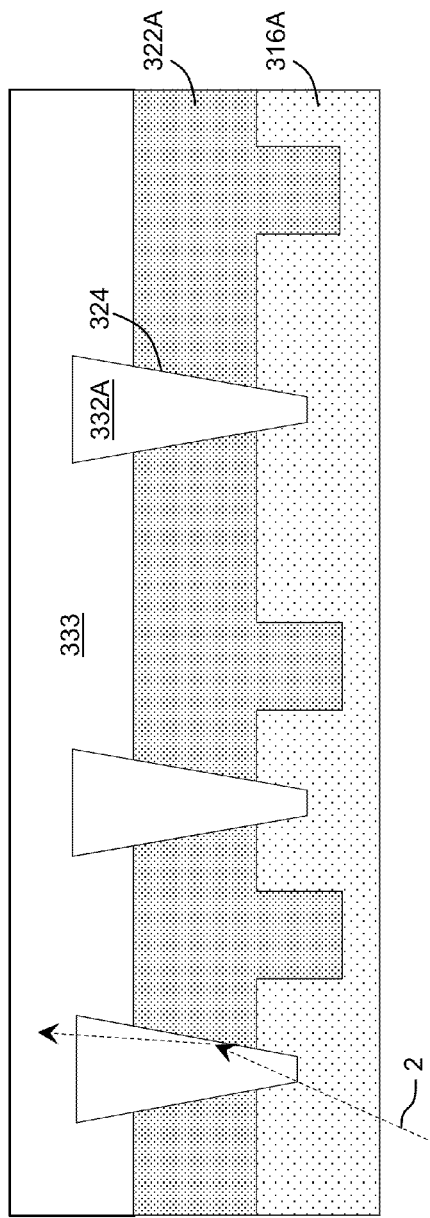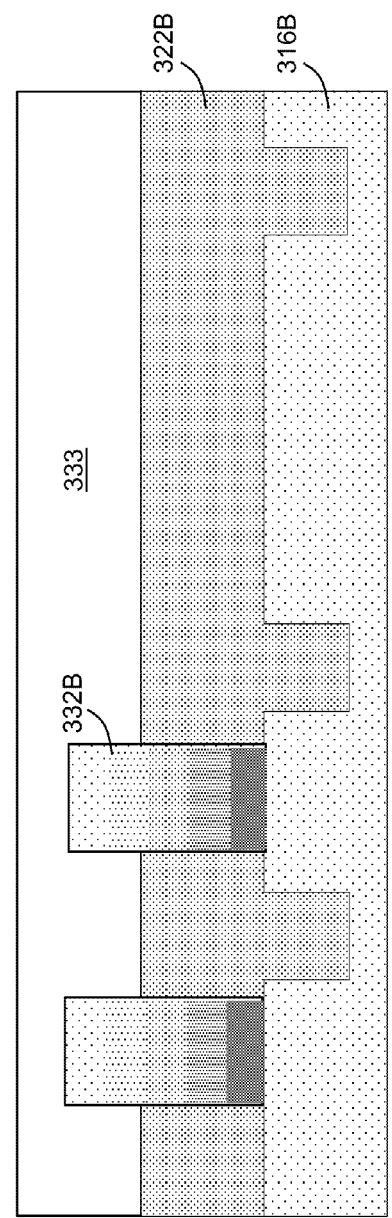

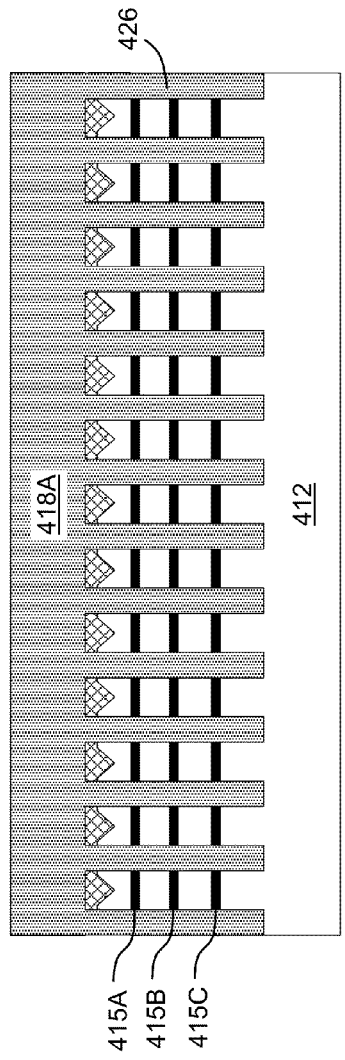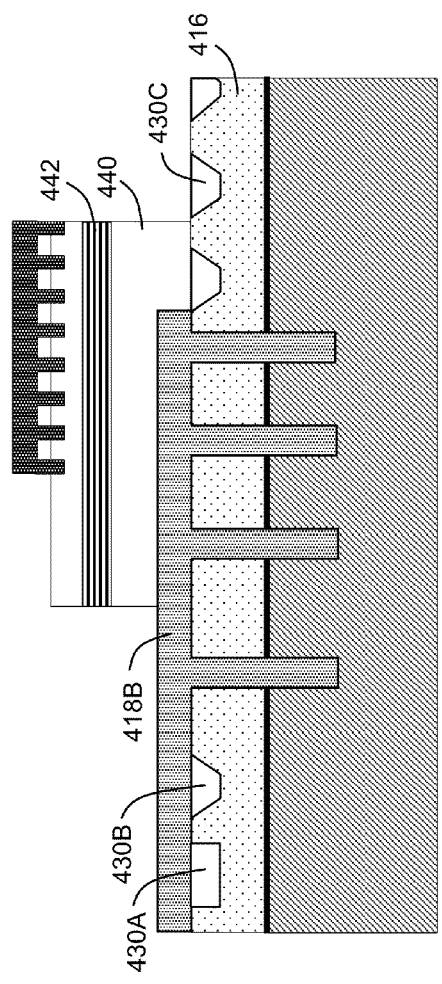

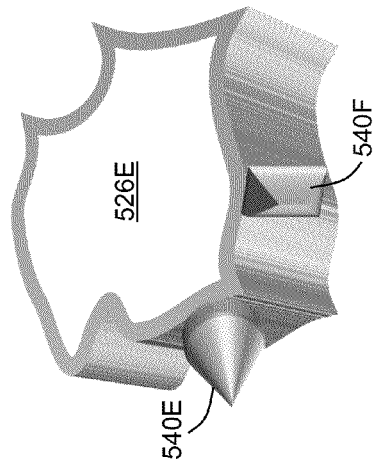
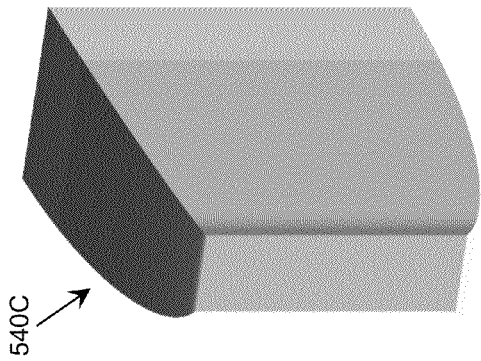
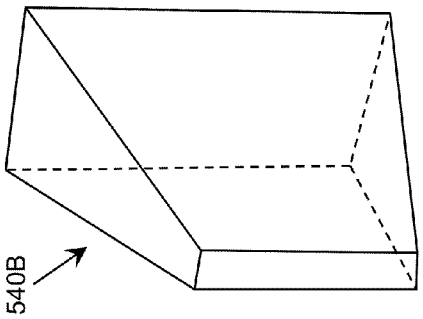
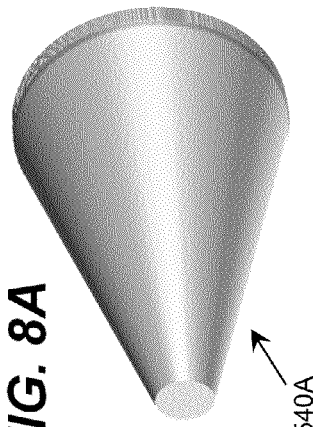
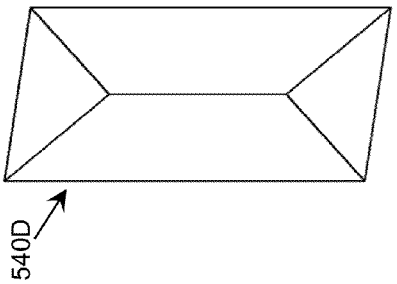

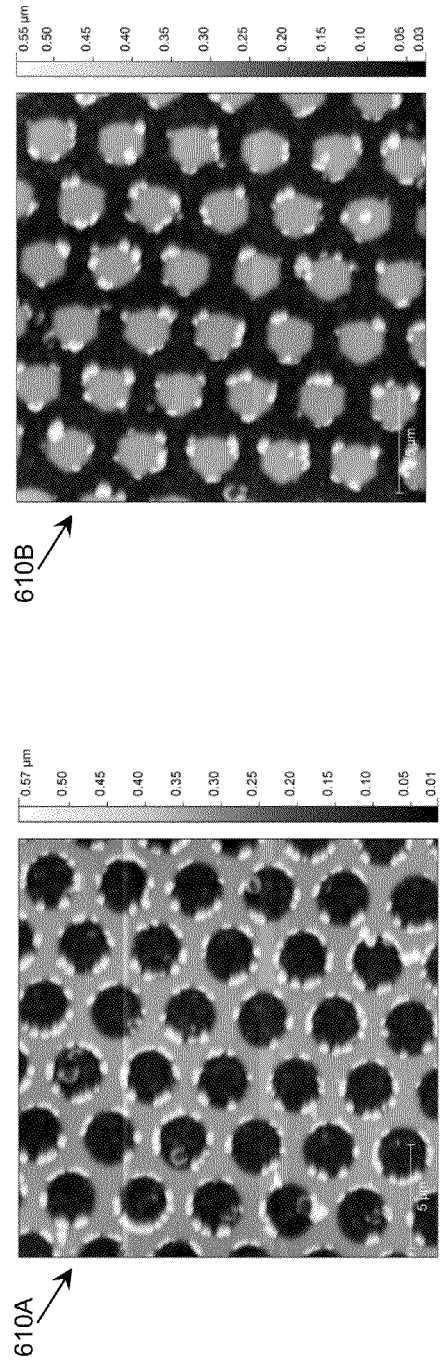
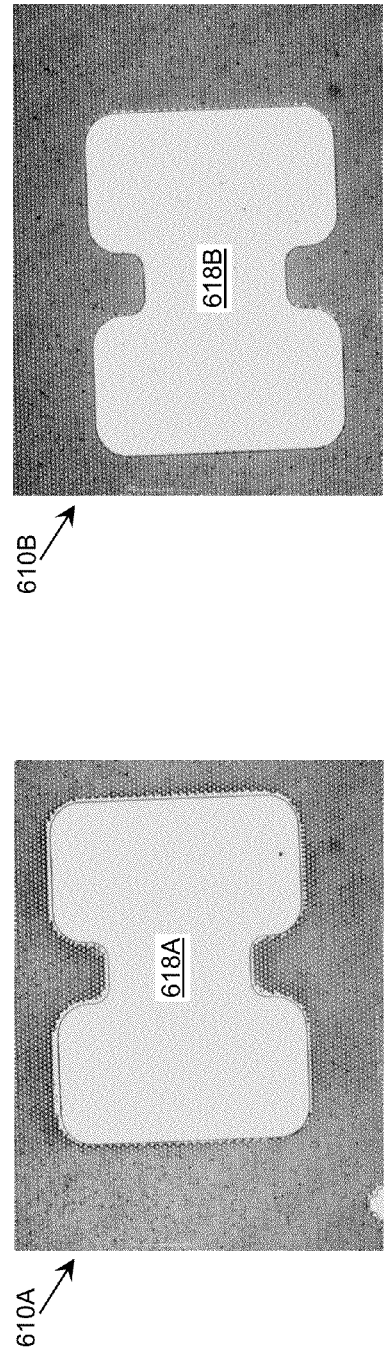
FIG. 9A
FIG. 9B
FIG. 9C
FIG. 9D

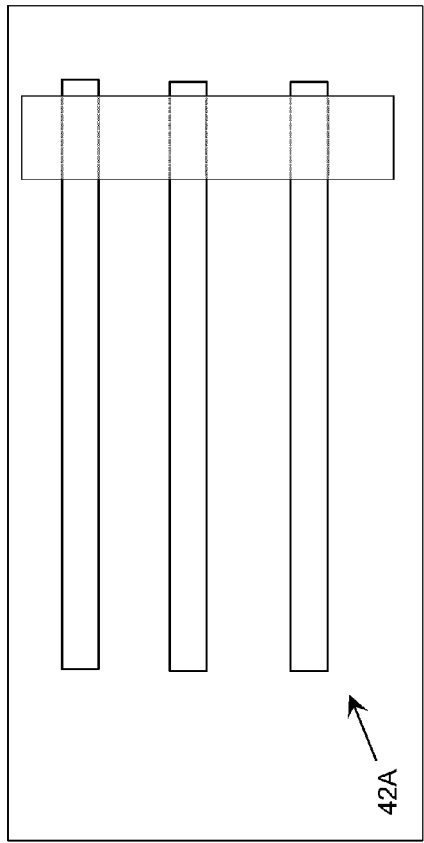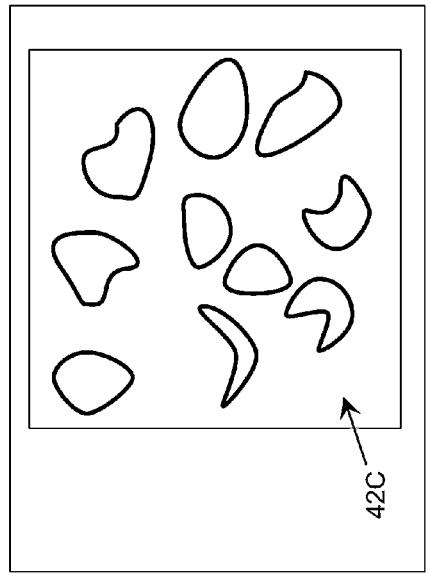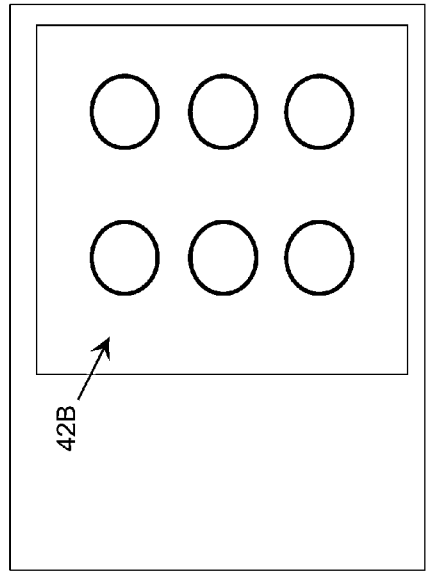

METALLIC CONTACT FOR OPTOELECTRONIC SEMICONDUCTOR DEVICE

REFERENCE TO RELATED APPLICATIONS

The current application claims the benefit of U.S. Provisional Application No. 61/670,808, titled "Ohmic Contact for Optoelectronic Semiconductor Device," which was filed on 12 Jul. 2012, and which is hereby incorporated by reference. Aspects of the invention are related to co-pending U.S. patent application Ser. No. 13/909,621, titled "Ohmic Contact to Semiconductor Layer," which was filed on 4 Jun. 2013, and which is hereby incorporated by reference.

TECHNICAL FIELD

The disclosure relates generally to metallic contacts, and more particularly, to an improved method of manufacturing a metallic contact to a semiconductor layer.

BACKGROUND ART

A challenge in developing optoelectronic semiconductor devices, such as light emitting diodes (LEDs), laser diodes (LDs), and photodiodes, is the development of an ohmic contact to n-type or p-type semiconductor layers, which has a low specific resistance while also having a high reflectivity or transparency. In general, most ohmic contacts to semiconductor layers are partially rectifying Schottky contacts, however, for the cases where the nonlinear contact behavior can be ignored, such contact are referred as ohmic. For example, the challenge to manufacture a low resistance ohmic contact to n-type material is particularly important for deep ultraviolet LEDs made from group III-nitride materials, such as Aluminum Gallium Nitride (AlGaN) or Aluminum Gallium Indium Nitride (AlGaInN), which include a high molar fraction of aluminum. Similarly, the challenge for manufacturing quality contacts to p-type nitride semiconductors is important for all nitride-based LEDs, since a relatively low p-doping (e.g., less than $1 \times 10^{18}$ cm$^{-3}$) in p-type GaN makes the formation of such p-type ohmic contacts difficult. Developing a good ohmic contact is particularly challenging for semiconductor layers containing high levels of aluminum. In particular, there are no metals that can match a high work function of p-doped AlGaN alloys. The resulting difference between semiconductor and metal work functions results in formation of an Schottky barrier at the metal semiconductor junction.

Various approaches have been employed to improve contact resistance for both n-type and p-type contacts. One approach, which can produce a good ohmic contact to a semiconductor layer, uses an annealing process. For example, titanium (aluminum gallium) nitride ($Ti_3(AlGa)N$) is frequently used as an ohmic contact to n-doped nitride semiconductor layers. In this case, the titanium nitride (TiN) layer creates N vacancies in the underlying aluminum gallium nitride/gallium nitride (AlGaN/GaN) structure, which effectively dopes the material. Frequently, gold (Au) also is added to prevent diffusion and oxidation of the TiN.

Another approach includes etching semiconductor layers and planting the ohmic contact into the etched cavity. For example, in one approach, recessed ohmic contacts are disclosed where a semiconductor device is formed by engineering a channel-forming layer grown on a semiconductor substrate with subsequent deposition of a Schottky layer. In this approach, the two dimensional electron gas (2DEG) is established at an interface between the Schottky layer and the channel-forming layer. Furthermore, in this approach, a gate electrode is formed on the Schottky layer via a cap layer and a recess-structured ohmic electrode is in ohmic contact with the 2DEG layer.

A similar technique has been used for Metal-Insulator-Semiconductor (MIS) high electron mobility transistors (HEMT). In this case, an insulating two nanometer thick AlN layer is removed and source and drain contacts are recessed. Contrary to the previous approach, the source and drain contacts are not recessed all the way to the 2DEG layer.

Recessed source and drain contacts also have been investigated in the context of transistor devices. Results have shown that a recessed source/drain structure can provide an ohmic contact with a much lower source/drain resistance than a conventional elevated source/drain contact. Furthermore, the recessed source/drain contact can reduce parasitic gate to source/drain capacitance over the conventional approach. A drawback of the recessed source and drain contacts is a presence of a short channel effect, which can deteriorate the device performance.

A recessed ohmic contact is useful as a way to access the 2DEG. A 2DEG is typically utilized in a HEMT, where the current path is formed at an interface between two types of semiconductor film having different band gaps. In order to support the 2DEG, the semiconductor layers typically comprise a channel-forming layer formed on a substrate and another layer forming a heterojunction with the channel-forming layer. For example, a GaN film can be used as the channel-forming layer, and an AlGaN film can be used as the layer forming the heterojunction with the channel-forming layer.

A recessed ohmic contact also is beneficial in cases when semiconductor layers do not support 2DEG, such as an ohmic contact formed for a light emitting device (LED). In this case, the recessed ohmic contact allows for a larger contact-to-semiconductor junction area, and as a result, a lower contact resistance.

Approaches for forming ohmic contacts are very different for n-type and p-type contacts. For n-type contacts to n-type GaN, for example, the ohmic contacts are formed using a metal work function that is smaller than that of the n-type GaN based semiconductor. A frequently used metal is Ti, which has a work function, $\phi_m$=4.33 eV. For Ti-based contacts to n-type GaN, which has a carrier concentration of 5 to $7 \times 10^{18}$ cm$^{-3}$, low contact resistances ranging from $10^{-5}$ to $10^{-8}$ $\Omega$cm$^2$ have been obtained.

Making a p-type contact to p-type GaN, for example, is much more difficult. In particular, it is difficult to grow well doped p-type GaN with a carrier concentration of more than $10^{18}$ cm$^{-3}$ due to a high activation energy of acceptors. Additionally, it is difficult to find metals with a work function that corresponds to p-type GaN. Metals with a large work function, such as Ni, are typically used to form ohmic p-type contacts. The details of annealing are an important factor for contact performance. Various annealing approaches have been proposed, including annealing in air or oxygen to improve contact performance. Other approaches to improve the performance of an ohmic contact include various methods of treating a semiconductor surface. The possible methods include plasma and laser treatment. In addition, use of superlattices, strained semiconductor layers, and spontaneous polarization have been employed to achieve a high hole concentration and result in a low contact resistivity.

In addition to improving the electrical properties of ohmic contacts, it is desirable to improve the optical properties of these contacts for more efficient operation of optoelectronic devices, such as LEDs, LDs, photodiodes, and the like. For example, for efficient operation of an LED device, the generated light needs to exit the device without significant absorption. Semiconductor LED devices, and particularly group III nitride-based semiconductor LED devices, are composed of semiconductor layers having a high refractive index. Such devices effectively trap the generated light by means of total internal reflection (TIR). Various approaches to improve extraction efficiency have been proposed. These approaches include surface patterning, surface roughening and LED die/LED substrate shaping. Each of these approaches relies on the ohmic contact being partially transparent or reflective, since most of the light absorption occurs at these contacts.

Similar to the various approaches proposed to improve electrical properties of ohmic contacts, various approaches have been proposed to improve the transparency or reflectivity of ohmic contacts. Semi-transparent metal contacts based on Ni/Au have been used to improve light extraction. Indium Tin Oxide (ITO) has been used as a transparent electrode for visible LEDs. Furthermore, strained p-type $In_{0.1}Ga_{0.9}N$ and highly doped InGaN layers have been used in conjunction with ITO to improve its electrical properties.

To improve the reflectivity of an ohmic contact, one approach uses a multi-layered contact containing aluminum and rhodium as a highly reflective ohmic contact. A high quality alloy contact, such as a Ni/Ag/Pt ohmic contact, was used as a reflective contact to a p-type GaN semiconductor layer. In this case, after annealing at 500° C. in $O_2$ ambient for three minutes, a specific contact resistance as low as $2.6 \times 10^{-5}$ $\Omega \cdot cm^2$ and an optical reflectivity of 82% at 460 nanometers were obtained.

Other approaches utilize distributed Bragg reflectors (DBRs) and omnidirectional reflectors to improve the reflectivity of ohmic contacts. DBRs have a high reflectivity, which strongly depends on both the incidence angle and the polarization of the incident light. As a result, DBRs become transparent for oblique angles of incidence. On the other hand, omnidirectional reflectors are designed to reflect light at various incident angles.

Another approach uses a mesh electrode to improve the extraction efficiency of GaN-based LEDs. A mesh electrode based on rhodium was manufactured for a p-type GaN contact instead of a typical Ni/Au electrode to reduce the optical absorption by the p-type contact electrode. The external quantum efficiency was estimated to be 35.5%. Similarly, striped contact electrodes have been proposed.

Other approaches roughen some of the contact surfaces to improve light extraction efficiency. For example, one approached investigated vertical-structured light emitting diodes (VLEDs) with a $GaO_x$ film atop an n-type GaN layer roughened via KrF laser irradiation and a $TiO_2/SiO_2$ DBR.

SUMMARY OF THE INVENTION

Aspects of the invention provide a contact to a semiconductor layer in a light emitting structure. The contact can include a plurality of contact areas formed of a metal and separated by a set of voids. The contact areas can be separated from one another by a characteristic distance selected based on a set of attributes of a semiconductor contact structure of the contact and a characteristic contact length scale of the contact. The voids can be configured to increase an overall reflectivity or transparency of the contact.

A first aspect of the invention provides a device comprising: a light emitting heterostructure semiconductor layer; and a contact to the semiconductor layer located over the semiconductor layer, wherein the contact includes: a semiconductor contact structure adjacent to the semiconductor layer; and a plurality of contact areas formed of a metal and separated by a set of voids over the semiconductor contact structure, wherein the plurality of contact areas have a characteristic distance selected based on a set of attributes of the semiconductor contact structure and a characteristic contact length scale of the contact.

A second aspect of the invention provides a method comprising: fabricating a metallic contact to a semiconductor contact structure in a light emitting device, the fabricating including forming a plurality of contact areas separated by a set of voids on the semiconductor contact structure, wherein the plurality of contact areas are formed of a metal and have a characteristic distance selected based on a set of attributes of the semiconductor contact structure and a characteristic contact length scale of the contact.

A third aspect of the invention provides a device comprising: a light emitting structure including a semiconductor contact structure; and a metallic contact to the semiconductor contact structure located over the semiconductor contact structure, wherein the metallic contact includes: a plurality of contact areas, wherein at least one of the plurality of contact areas includes: a plurality of perforating elements, each perforating element comprising a metal deposited in a cavity in the semiconductor contact structure, wherein a depth of the cavity exceeds at least a thickness of a top semiconductor layer of the semiconductor contact structure; and a top layer of metal located over an area of the semiconductor contact structure including the plurality of perforating elements; and a set of voids where no metal is located, wherein at least one of the set of voids is configured based on one of: a reflectivity or a transparency of light emitted by the light emitting structure.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 1A and 1B show top and lateral views, respectively, of an illustrative portion of a device according to an embodiment.

FIG. 2 shows a lateral view of an illustrative portion of a device including an ohmic contact according to another embodiment.

FIG. 3 shows a lateral view of an illustrative interface between a conducting metal and a top layer of a semiconductor structure according to an embodiment.

FIGS. 5A and 5B show lateral views of an illustrative portion of devices including ohmic contacts according to embodiments.

FIGS. 6A and 6B show lateral views of an illustrative portion of devices including ohmic contacts according to embodiments.

FIGS. 8A-8E show shapes and scales of illustrative protrusions forming sharp edges according to embodiments.

FIGS. 9A-9D show top views of portions of illustrative devices having pillars and cavities with and without an ohmic contact formed thereon according to embodiments.

FIGS. 10A-10C show illustrative arrangements of perforating elements according to embodiments.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 4A:
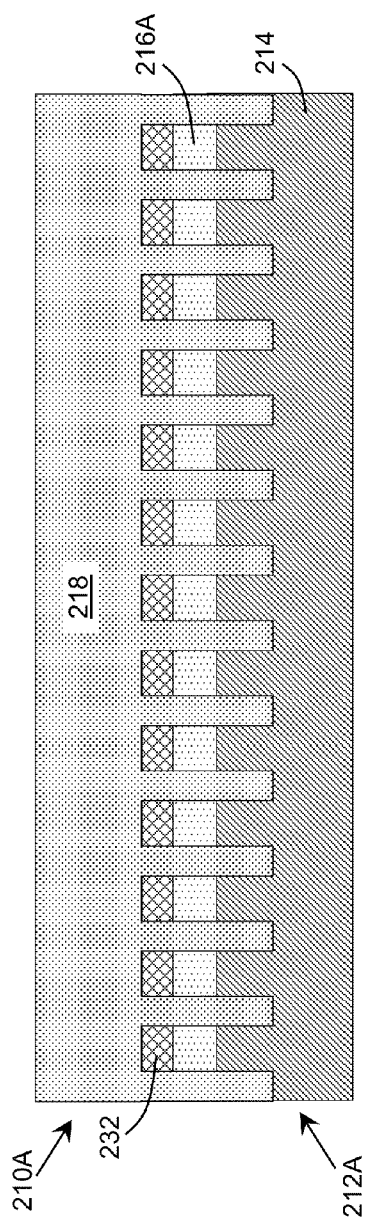
FIGS. 4A and 4B show lateral views of an illustrative portion of devices including ohmic contacts according to embodiments.

As indicated above, aspects of the invention provide a metallic contact to a semiconductor layer in a light emitting structure. The contact can include a plurality of contact areas formed of a metal and separated by a set of voids. The contact areas can be separated from one another by a characteristic distance selected based on a set of attributes of a semiconductor contact structure of the contact and a characteristic contact length scale of the contact. The voids can be configured to increase an overall reflectivity or transparency of the contact. A metallic contact described herein can have a reduced Schottky barrier such that the nonlinear contact behavior can be ignored, which is referred to as an "ohmic contact" herein. As used herein, unless otherwise noted, the term "set" means one or more (i.e., at least one) and the phrase "any solution" means any now known or later developed solution.

Turning to the drawings, FIGS. 1A and 1B show top and lateral views, respectively, of an illustrative portion of a device 10 according to an embodiment. In an embodiment, the device 10 is an optoelectronic device. For example, the device 10 can comprise a light emitting device, such as a light emitting diode (LED), a laser diode (LD), a photodiode, and/or the like. The light generated by the light emitting device 10 can have a wavelength in any corresponding region of the electromagnetic spectrum. In an illustrative embodiment, the light emitting device 10 is configured to emit deep ultraviolet radiation. However, it is understood that this is only illustrative of various devices and types of devices to which aspects of the invention can be applied.

In an embodiment, the device 10 includes a group III-V materials based light emitting heterostructure, in which some or all of the various layers of the heterostructure are formed of elements selected from the group III-V materials system. In a more particular illustrative embodiment, the various layers of the heterostructure of the device 10 are formed of group III nitride materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

In an embodiment, the device 10 includes a semiconductor contact structure 12 (FIG. 1B) to a light generating heterostructure, which includes at least a first semiconductor layer 14 (FIG. 1B) and a second semiconductor layer 16. In an embodiment, the second semiconductor layer 16 is partially insulating, while the first semiconductor layer 14 is highly conducting. While aspects of the invention are described in conjunction with a pair of layers 14, 16, it is understood that the semiconductor contact structure 12 can include any number of layers. These layer(s) can be configured to provide any desired functionality during operation of the corresponding device 10. For example one or more layers can be located directly on the second semiconductor layer 16, including for example, a layer of low conductive material, an isolating layer of material, a barrier layer, a passivation layer, a protective coating, a reflective coating, an antireflective coating, and/or the like.

The device 10 further includes an ohmic contact 18. The ohmic contact 18 is formed of a plurality of islands 20A-20D, each of which can be formed of a conducting metal 22. As illustrated, the conducting metal 22 of two or more of the islands, such as islands 20A and 20C, can be connected. Regardless, the area of the ohmic contact 18 includes voids 24A, 24B, which correspond to regions within a boundary defined by the ohmic contact 18 (e.g., defined by the plurality of islands 20A-20D) in which no conducting material 22 is present on the surface of the semiconductor layer 16. The islands 20A-20D and voids 24A, 24B can have any pattern, including a random pattern, a periodic pattern, and/or the like. In an embodiment, the voids comprise deep etched cavities, which have a depth comparable to a thickness of a semiconductor layer grown on a substrate.

In an embodiment, each of the islands 20A-20D includes a plurality of perforating elements 26, which penetrate (e.g., are recessed into) one or more semiconductor layers 14, 16 located below the island 20A-20D. The perforating elements 26 can have sharp edges, and when the ohmic contact 18 is to a two-dimensional carrier gas (e.g., formed at a junction of the semiconductor layers 14, 16), the perforating elements 26 can be sufficiently deep to penetrate the layers 14, 16 containing the two-dimensional carrier gas. In this manner, the ohmic contact 18 can provide a lower contact resistivity than a regular annealed contact and/or reduce current crowding in the device 10. Regardless, it is understood that the ohmic contact 18 also can be used where there is no two-dimensional carrier gas. In this case, the ohmic contact 18 also can reduce overall contact resistance due to an increased perimeter of the ohmic electrode and an increased current around the sharp edges of the electrode protrusions. Furthermore, embodiments of the invention can be utilized in semiconductor devices containing multiple two-dimensional carrier gas regions.

Additionally, the ohmic contact 18 can include a reflective layer 28 located over the islands 20A-20D and the voids 24A, 24B, which can improve the reflective properties of the ohmic contact 18. The reflective layer 28 can be formed of any material reflective of light having a wavelength corresponding to the wavelength of the light generated by the light generating heterostructure. The reflective layer 28 can have an index of refraction (refractive index) lower than that of the semiconductor layer 16. In an embodiment, the reflective layer 28 is formed of a reflective metal, such as aluminum.

FIG. 2 shows a lateral view of an illustrative portion of a device 110 including an ohmic contact 18 according to another embodiment. In this case, the device 110 includes a semiconductor contact structure 112, which includes at least a first semiconductor layer 114 and a second semiconductor layer 116 with a two-dimensional carrier gas 115 formed at a heterojunction of the layers 114, 116, and an ohmic contact 18 to the two-dimensional carrier gas 115. The conducting metal 22 forming the metal islands of the ohmic contact 18 as described herein is formed on a surface of the layer 116, which also includes a set of voids 130A, 130B formed thereon. The voids 130A, 130B can comprise random roughness, have a periodic or otherwise ordered patterning, and/or the like. As illustrated, the voids 130A, 130B can be located below the conducting metal 22 forming the metal islands, or can be located where there are voids 24A, 24B between the metal islands.

In an embodiment, the voids 24A, 24B and/or the voids 130A, 130B can be filled with a filler, such as silicon dioxide ($SiO_2$), and/or the like. Alternatively, the voids can include roughness, such as a filler that contains roughness or a surface roughness. For example, FIG. 3 shows a lateral view of an illustrative interface between the conducting metal 22 and the top layer 116 according to an embodiment. In this case, the voids 24A, 24B have a filler 31A, 31B deposited therein. As illustrated, the void 24B is aligned with a void 130C, which results in the filler 31B being present in the void 130C. The filler 31A, 31B can contain diffusive scattering centers or be filler roughness, which can serve to reflect light 2 back into the semiconductor structure. For example, the interface roughness can be due to nano- and/or micro-scale surface roughness of the underlying semiconductor layer 116. Illustrative filler materials include silicon dioxide, silicon nitride, ultraviolet grade fused silica, calcium fluoride ($CaF_2$), magnesium fluoride $MgF_2$, and/or the like.

Figure 4B:
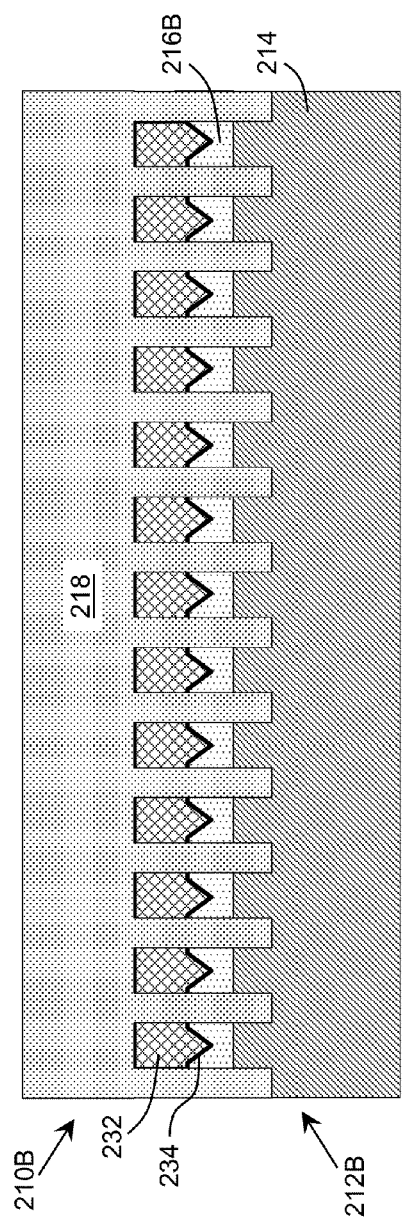

FIGS. 4A and 4B show lateral views of an illustrative portion of devices 210A and 210B, respectively, including ohmic contacts 218 according to embodiments. In this case, each ohmic contact 218 includes an overlying conducting metal layer connected to the underlying semiconductor contact structure 212A, 212B, respectively, by the use of the perforating elements described herein. While the ohmic contacts 218 are not shown including metal islands or a separate layer of reflective metal, it is understood that another embodiment of the ohmic contacts 218 can include metal islands and/or a layer of reflective material as described herein. In an embodiment, the ohmic contacts 218 are formed of a metal, which is reflective of light generated by the corresponding device 210A, 210B.

Each device 210A, 210B further includes a semiconductor contact structure 212A, 212B (e.g., of a light generating heterostructure), respectively, including a set of semiconductor layers 214 and a top semiconductor layer 216A, 216B, respectively. While not shown, it is understood that the semiconductor contact structures 212A, 212B can include a two dimensional carrier (e.g., electron or hole) gas as described herein. The conducting layer of the ohmic contact 218 is separated from the corresponding semiconductor contact structure 212A, 212B by a filler material 232 (e.g., silicon dioxide or the like). In FIG. 4B, a top surface 234 of the top semiconductor layer 216B is roughened or patterned, e.g., by including pyramids, holes, etched roughness, or the like, which can be configured to scatter light, e.g., generated in the semiconductor contact structure 212B. While not shown, it is understood that a top surface of the filler material 232 also can be roughened/patterned.

In an embodiment, one or more of the voids in the conducting metal can be configured to improve light extraction from the device. For example, FIGS. 5A and 5B show lateral views of an illustrative portion of devices including ohmic contacts according to embodiments. In FIG. 5A, the voids 324 in the conducting metal 322A and/or the top layer 316A have an inverted truncated pyramid shape, which can improve extraction of light 2 from the device. In an embodiment, the voids 324 can be filled with a filler 332A in the shape of an inverted truncated cone (or pyramid), which can protrude from the conducting metal 322A into an encapsulant 333, e.g., to provide a better inverted cone height to area ratio for the light extraction. The encapsulant 333 can comprise any material(s) selected and configured based on the device and the desired functionality/attributes for the encapsulant (e.g., light emission, protective covering, and/or the like). Illustrative filler materials include silicon dioxide, silicon nitride, ultraviolet grade fused silica, calcium fluoride ($CaF_2$), magnesium fluoride $MgF_2$, and/or the like.

In FIG. 5B, one or more of the voids in the conducting metal 322B (and/or the top semiconductor layer 316B) are filled with a filler 332B having a graded composition, which forms a pillar protruding from the conducting metal 322B. The material of the graded composition filler 332B can have a refractive index that is comparable to a refractive index of the top semiconductor layer 316B at the bottom of the void adjacent to the top semiconductor layer 316B and gradually changes to a refractive index comparable to a refractive index of an encapsulant 333 over the conducting metal 322B. The graded composition filler 332B can be, for example, anodized aluminum oxide (AAO) with variable density and/or pore sizes. Furthermore, the graded composition filler 332B can be formed by laminating layers with different refractive indices. For example, fused silica can be laminated with AAO. While pillar and inverted truncated cone shapes are shown, it is understood that these shapes are only illustrative of various possible shapes including, for example, an upright truncated cone.

It is understood that various alternative configurations are possible, which can include one or more of the features described herein. For example, FIGS. 6A and 6B show lateral views of an illustrative portion of devices including ohmic contacts according to embodiments. In FIG. 6A, the semiconductor contact structure 412 includes multiple two dimensional carrier gases 415A-415C at different levels of the semiconductor contact structure 412. As illustrated, the ohmic contact 418A includes perforating elements 426 that penetrate and are coupled to each of the two dimensional carrier gases 415A-415C. In FIG. 6B, the top semiconductor layer 416 can include surface patterning 430A-430C in both areas covered by the ohmic contact 418B and in areas not covered by the ohmic contact 418B. The device shown in FIG. 6B can be, for example, a light emitting diode with a mesa region 440 and an active region 442. For such embodiment, both n-type and p-type contacts can have a perforated structure and a reduced specific resistance. In an embodiment, the areas not covered by the ohmic contact 418B are covered with an encapsulant, such as, for example, $SiO_2$.

The surface patterning described herein can have any of various configurations. In an embodiment, the patterning comprises a roughness on a nanometer scale. A shape and/or a dimension of the patterned elements can vary with etching depth. In an embodiment, the patterning is configured to form a two dimensional photonic crystal.

Figure 7A:
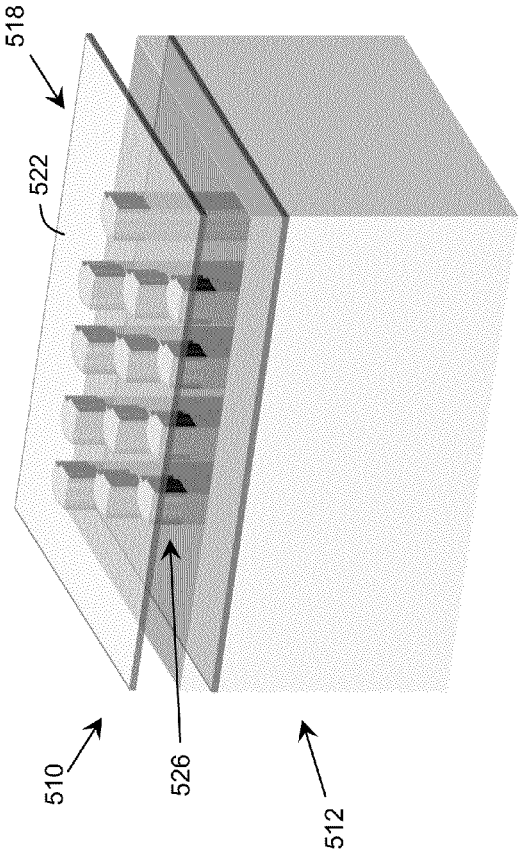
FIGS. 7A-7C show a portion of an illustrative device which show an illustrative configuration for the perforating elements according to an embodiment.
Figure 7C:
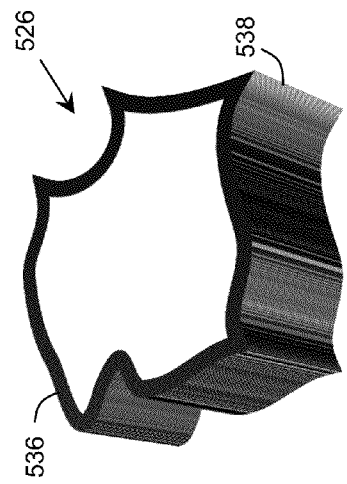
Figure 7B:
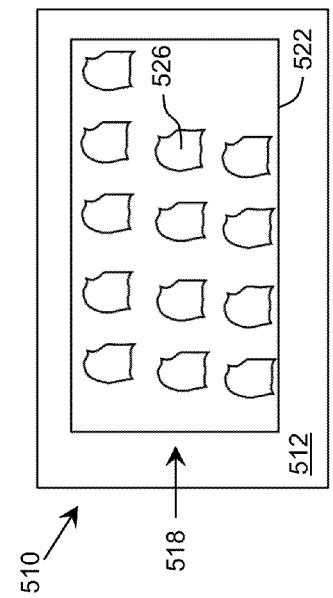

As described herein, the perforating elements can have sharp edges. FIGS. 7A-7C show a portion of an illustrative device 510 which show an illustrative configuration for the perforating elements according to an embodiment. In particular, FIG. 7A shows a perspective view and FIG. 7B shows a top view of the device 510. The device 510 includes a semiconductor contact structure 512 including a set of semiconductor layers, which can include one or more regions having a two-dimensional carrier (e.g., electron or hole) gas.

The device 510 also is shown including a perforating ohmic contact 518. The contact 518 includes a metallic layer 522 and a plurality of perforating elements 526 (e.g., recessed electrodes). The plurality of perforating elements 526 can extend entirely through a first layer and a two-dimensional carrier gas and at least partially extend into a second layer of the semiconductor contact structure 512. The metallic layer 522 connects at least a portion of the plurality of perforating elements 526 to one another. As a result, the layer 522 and the perforating elements 526 together form the perforating ohmic contact 518. It is understood that the semiconductor contact structure 512 can include any number of layers between the metallic layer 522 and a target semiconductor layer of the semiconductor contact structure 512. These layer(s) can be configured to provide any desired functionality during operation of the corresponding device 510, including for example, a layer of low conductive material, an isolating layer of material, a barrier layer, a passivation layer, a protective coating, a reflective coating, an antireflective coating, and/or the like.

FIG. 7C shows a more detailed view of a perforating element 526 according to an embodiment. As illustrated, the perforating element 526 has a perimeter 536 that is generally not smooth and can include a set of sharp edges 538. The sharp edges 538 can lead to an increased conductance and an overall improvement in the performance of the perforating ohmic contact 526. As described herein, the perimeter 536 including the sharp edges 538 can be formed from a set of metal protrusions (bulges) laterally extending from the perforating element 526 and penetrating a corresponding semiconductor layer (e.g., layers 14, 16 of FIG. 1B). These metal protrusions can make the perimeter 536 a complex shape and increase the periphery of the perforating element 526.

FIGS. 8A-8E show shapes and scales of illustrative protrusions 540A-540D forming sharp edges according to embodiments. In particular, FIGS. 8A-8D show illustrative protrusions 540A-540D, including a frustum 540A (resembling a cone), a rectangular frustum 540B (resembling a pyramid), a rectangular frustum 540C having sloping sides, and a triangular prism 540D. However, it is understood that these are only illustrative shapes for protrusions 540A-540D, and a protrusion can have any geometric shape, including any complex and/or irregular geometric shape.

As shown in FIG. 8E, a protrusion, such as the protrusions 540E, 540F shown therein, can comprise a side bulge from a perforating element 526E. In an embodiment, a protrusion can have a bottom base, which is adjacent to the corresponding perforating element 526E, and a top base, which is at an end located furthest from the corresponding perforating element 526E in the semiconductor layer. In this case, the top base can have a cross section that is smaller than a cross section of the bottom base. Furthermore, a characteristic lateral size of the protrusion can be greater than or equal to one half of the Bohr radius in the corresponding semiconductor layer and/or the two-dimensional carrier gas region. Additionally, the characteristic lateral size of the protrusion can be less than a characteristic length scale separating the perforating element 526E from one or more adjacent perforating elements.

A device, which includes one or more contacts described herein, can be fabricated using any solution. Returning to FIGS. 1A and 1B as an illustrative embodiment, the semiconductor contact structure 12 can be fabricated using any solution. For example, the semiconductor contact structure 12 can be formed as part of a group III nitride based light emitting heterostructure. In this case, fabrication of the heterostructure can include: growing an AlN buffer layer on a substrate, such as sapphire; growing a GaN layer 14 above the buffer layer; and growing an AlGaN layer 16 above the GaN layer 14. In this case, the semiconductor layer 14 having a high gallium content is capped with a layer of high aluminum content to form a two-dimensional carrier gas at the heterojunction of the layers 14, 16. As described herein, the two-dimensional carrier gas can comprise an electron gas or a hole gas. In general, all aspects of the invention described herein are applicable to both two-dimensional electron and hole gases.

Subsequently, a plurality of cavities, each corresponding to a location for a perforating element 26, can be formed in the semiconductor contact structure 12, e.g., using an etching process. One or more of the plurality of cavities can have a depth that fully penetrates (e.g., is deeper than) one or more of the semiconductor layers 14, 16 in the semiconductor contact structure 12. In an embodiment, when the contact 18 is formed over a two-dimensional carrier gas, the cavities can have a depth that is deeper than the two-dimensional carrier gas. An illustrative depth of the cavities can be few tens of nanometers.

The plurality of cavities can be formed in any pattern and/or spacing. In an embodiment, the plurality of cavities are separated from each other by a characteristic length scale. The characteristic length scale can be selected based on a sheet resistance of a semiconductor layer, such as the semiconductor layer 14, and a contact resistance per unit length of a metal to be used for the perforating elements 26. For example, the placement/spacing of the perforating elements 26 in the semiconductor contact structure 12 can comprise an optimization parameter, which can be selected to decrease a resistance of the corresponding ohmic contact 18. In an embodiment, the resistance of the contact, $R_C$, has minima at a value of x given by $x=\sqrt{CR_{sh}AP/R_m}$, where C is a constant that depends on a shape of the electrode and is on the order of unity; $R_{sh}$ is a resistance of the semiconductor layer or two-dimensional carrier gas per square; A is an area of a perforating element 26; P is a perimeter of a perforating element 26; and $R_m$ is a specific resistance between the metal of the perforating element 26 and the semiconductor layer or two-dimensional carrier gas. This value can be used to select a characteristic length scale for spacing the cavities, and therefore the corresponding perforating elements 26, as described herein.

In an embodiment, the plurality of cavities are formed using a multi-step etching process. For example, plasma assisted etching can be used during a first etching step, which is followed by wet etching during a second etching step. Wet etching can utilize, for example, hydrofluoric acid, which can selectively etch along grain boundaries, dislocations, and other lattice defects, resulting in a non-uniform and complex etched relief. Such a relief can promote formation of an increased number of electrode protrusions during subsequent formation of the ohmic contact 18.

After formation of the cavities, a metal for the perforating elements 26 can be deposited into the cavities to form the plurality of perforating elements 26. Depending on a type of ohmic contact desired, different metals can be chosen for the perforating elements 26. For example, titanium/aluminum (Ti/Al) can be used to form perforating elements 26 to an n-doped nitride semiconductor layer. For perforating elements 26 to a p-type semiconductor layer, a metal with a larger work function, such as nickel and/or palladium can be used.

Subsequently, the semiconductor contact structure 12 and the metal located in the cavities can be annealed. The annealing can be performed using a set of conditions configured to ensure formation of a set of metal protrusions laterally penetrating the semiconductor layer(s) from the perforating elements 26. In an embodiment, the set of annealing conditions includes a temperature less than or equal to 850 degrees Celsius for forming a metal contact to a group III nitride semiconductor layer. In a more particular embodiment, the annealing includes rapid thermal annealing lasting for about a minute at about 600 degrees Celsius, followed by four to eight minute annealing at about 400 degrees Celsius. The annealing can be carried out in an $N_2$ atmosphere.

In an embodiment, the annealing is configured to control a complexity and/or direction of the metal protrusions extending from a perforating element 26. For example, use of a relatively high temperature rapid annealing, where temperatures can reach up to approximately 850 degrees Celsius for a duration of less than a minute, can result in metal protrusions that extend laterally throughout the two dimensional carrier gas. In a more particular embodiment, rapid annealing lasting approximately forty-five seconds can be used to obtain a desired set of metal protrusions.

A perforating element 26 can have a shape and/or a dimension, which varies with the depth of the perforating element 26. The variation can be a result of the etching process and/or the formation of the set of metal protrusions. The set of metal protrusions can be conducive to field emission and/or field-enhanced thermionic emission. Furthermore, a characteristic lateral size of the metal protrusions can be at least one half the Bohr radius in the semiconductor layer(s) and/or the two-dimensional carrier gas (if present). In an embodiment, the characteristic lateral size also is less than the characteristic length scale. The perforating elements described herein can have any of various configurations. In an embodiment, the perforating elements are located in a pattern which forms a two dimensional photonic crystal. In another embodiment, a total contact area for a contact is increased by at least a factor of two by the perforating elements.

The plurality of islands 20A-20D can be formed using any solution. Each island 20A-20D can connect a corresponding plurality of perforating elements 26 and can be formed of the same metal as used in forming the perforating element 26. For example, a masking material, such as silicon dioxide, can be randomly applied and/or applied in an ordered pattern onto the surface of the semiconductor contact structure 12. Subsequently, the metal forming the islands 20A-20D can be deposited in the locations where the masking material is not present. The masking material can be removed or remain in place. Alternatively, the islands 20A-20D can be formed using a set of application conditions that causes the random formation of the islands 20A-20D on a surface of the semiconductor contact structure 12. The deposition process can include thermal evaporation, e-beam deposition, magnetron sputtering, evaporation by laser beam, and/or the like. In this case, the voids 24A, 24B can subsequently be filled with a filler material, if desired. Regardless, a reflective layer 28 can be formed over the islands 20A-20D and the voids 24A, 24B using any solution. In an embodiment, the islands 20A-20D can form a plasmonic crystal structure for out-coupling electromagnetic radiation.

It is understood that various embodiments can include different, fewer, and/or additional processing steps. For example, as shown in FIG. 2, a set of voids 130A, 130B can be formed on a top surface of the semiconductor contact structure 12 using any solution (e.g., etching holes or the like). The voids 130A, 130B can be formed, for example, after formation of the perforating elements as described herein. The voids 130A, 130B can be filled with a filler material, such as silicon dioxide or the like. Subsequently, the conducting metal 22 (e.g., islands) and/or the reflective layer 28 can be formed as described herein. To this extent, the conducting metal 22 can include voids 24A, 24B, which also can be filled with a filler material as shown and described in conjunction with FIGS. 3, 5A, and 5B.

For the devices shown in FIGS. 4A and 4B, manufacture of the corresponding ohmic contact 218 can include applying a filler material 232 (e.g., silicon dioxide) on the surface of the semiconductor contact structure 212A, 212B. As shown in FIG. 4B, prior to applying the masking material, the process can include roughening the surface of the semiconductor contact structure 212B, e.g., by etching pyramids, holes, and/or other roughness into the surface of the semiconductor layer 216B. Locations of the filler material 232 designated for the perforating elements of the contact 218 can be removed. Alternatively, the filler material 232 can be applied using a mask, in which the locations of the perforating elements are not covered by the filler material 232. In either case, cavities can be formed (e.g., etched) in the semiconductor contact structure 212A, 212B in the locations for the perforating elements. Subsequently, the metallic contact 218 can be formed, e.g., by depositing an ohmic metal into the etched cavities, depositing a conducting top metal cap over the etched cavities and masked region, annealing the structure, and/or the like. In an embodiment, the filler material 232 can be thinned after depositing the ohmic metal into the etched cavities, but prior to depositing the conducting top metal cap.

The masking/filler material described herein can be selected such that the material has a low index of refraction as compared to the underlying semiconductor layer. Furthermore, the masking/filler material can have an index of refraction that is greater than or equal to an index of refraction of a surrounding device encapsulant. In an embodiment, the masking/filler material has an index of refraction approximately equal to an average of the indexes of refraction for the semiconductor layer and the encapsulant. Illustrative materials include silicon dioxide ($SiO_2$), magnesium fluoride ($MgF_2$), organic polymer, silicone, organofluorine, silica, alumina based sol-gel, and/or the like. In an embodiment, the filler material comprises zirconium dioxide ($ZrO_2$).

While the semiconductor structure has been shown and described as having cavities formed therein for the ohmic contact, an embodiment can form a plurality of pillars in the semiconductor structure over which the ohmic contact is formed. The pillars can be formed using any solution, e.g., by removing all but a series of islands of the masking material prior to etching the semiconductor structure to a desired depth. FIGS. 9A-9D show top views of portions of illustrative devices having pillars and cavities with and without an ohmic contact formed thereon according to embodiments. In particular, FIGS. 9A and 9B show an illustrative device 610A with cavities (dark circles) formed in the semiconductor structure, and with an ohmic contact 618A formed thereon shown in FIG. 9B. In this case, the perforating elements fill the cavities. FIGS. 9C and 9D show an illustrative device 610B with pillars (light circles) formed on the semiconductor structure, and with an ohmic contact 618B formed thereon shown in FIG. 9D. In this case, the perforating elements fill the areas (voids) between the islands.

The contact islands 20A-20D (FIGS. 1A and 1B) of an ohmic contact 18 (FIGS. 1A and 1B) can be arranged in any of various types of patterns. For example, FIGS. 10A-10O show illustrative arrangements 42A-42C of contact islands according to embodiments. In FIG. 10A, the arrangement 42A includes contact islands formed in a blade arrangement, in which each contact island is an elongate member located in parallel with the other contact islands. In FIG. 10B, the arrangement 42B includes cylindrical contact islands formed in a rectangular array. In FIG. 10C, the arrangement 42C includes contact islands of different, irregular shapes and having an irregular distribution. It is understood that these arrangements 42A-42C are only illustrative of various types of arrangements that can be utilized in embodiments of the ohmic contact. Furthermore it is understood that similar arrangements can be utilized for the locations of the perforating elements 26 (FIGS. 1A and 1B) corresponding to each contact island.

Figure 11:
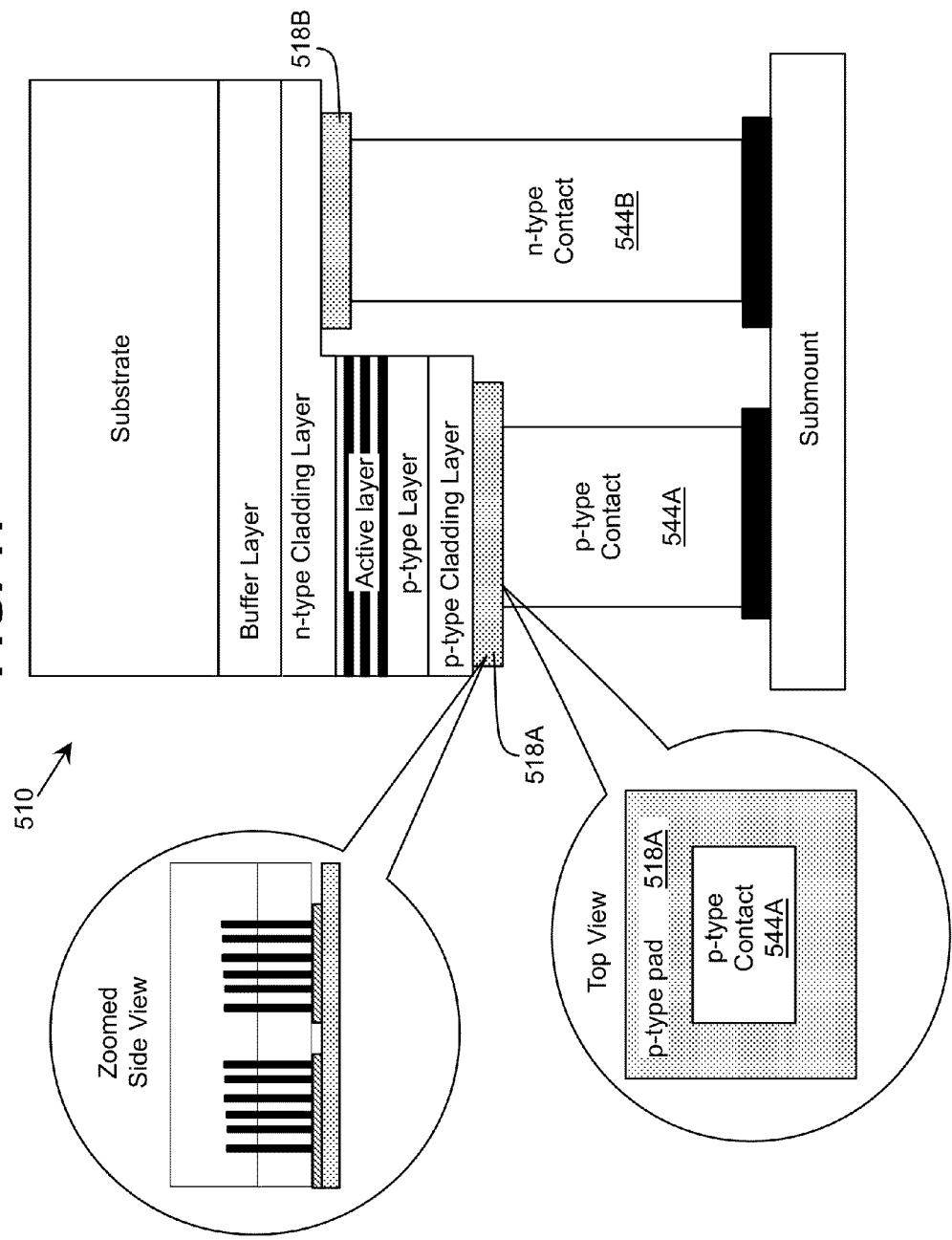
FIG. 11 shows a schematic structure of an illustrative emitting device according to an embodiment.

As described herein, a device including an ohmic contact described herein can comprise a light emitting device, such as a light emitting diode (LED), a laser diode (LD), a photodiode, and/or the like. FIG. 11 shows a schematic structure of an illustrative emitting device 510 according to an embodiment. The emitting device 510 includes a heterostructure comprising a substrate, a buffer layer adjacent to the substrate, an n-type cladding layer (e.g., an electron supply layer) adjacent to the buffer layer, and an active region adjacent to the n-type cladding layer. Furthermore, the heterostructure of the emitting device 510 includes a p-type layer (e.g., an electron blocking layer) adjacent to the active region and a p-type cladding layer (e.g., a hole supply layer) adjacent to the p-type layer. In a more particular illustrative embodiment, the emitting device 510 is a group III-V materials based device, in which some or all of the various layers are formed of elements selected from the group III-V materials system.

In a still more particular illustrative embodiment, the various layers of the emitting device 510 are formed of group III nitride based materials. An illustrative embodiment of a group III nitride based emitting device 510 includes an active region (e.g., a series of alternating quantum wells and barriers) composed of $In_yAl_xGa_{1-x-y}N$, $Ga_zIn_yAl_xB_{1-x-y-z}N$, an $Al_xGa_{1-x}N$ semiconductor alloy, or the like. Similarly, both the n-type cladding layer and the p-type layer can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers. The substrate can be sapphire, silicon carbide (SiC), silicon (Si), GaN, AlGaN, AlON, $LiGaO_2$, or another suitable material, and the buffer layer can be composed of AlN, an AlGaN/AlN superlattice, and/or the like.

As shown with respect to the emitting device 510, a p-type metal pad 518A can be attached to the p-type cladding layer and a p-type contact 544A can be attached to the p-type metal pad 518A. Similarly, an n-type metal pad 518B can be attached to the n-type cladding layer and an n-type contact 544B can be attached to the n-type metal pad 518B. As shown in the zoomed lateral view of the p-type metal pad 518A, one or both of the metal pads 518A, 518B can comprise an ohmic contact to the corresponding cladding layer configured as described herein. As illustrated in the top view, the contacts 544A, 544B can occupy a fraction of the area of the metal pads 518A, 518B, respectively. In this case, the remainder of the area of the metal pads 518A, 518B can be perforated, partially removed, and/or the like.

Figure 12:
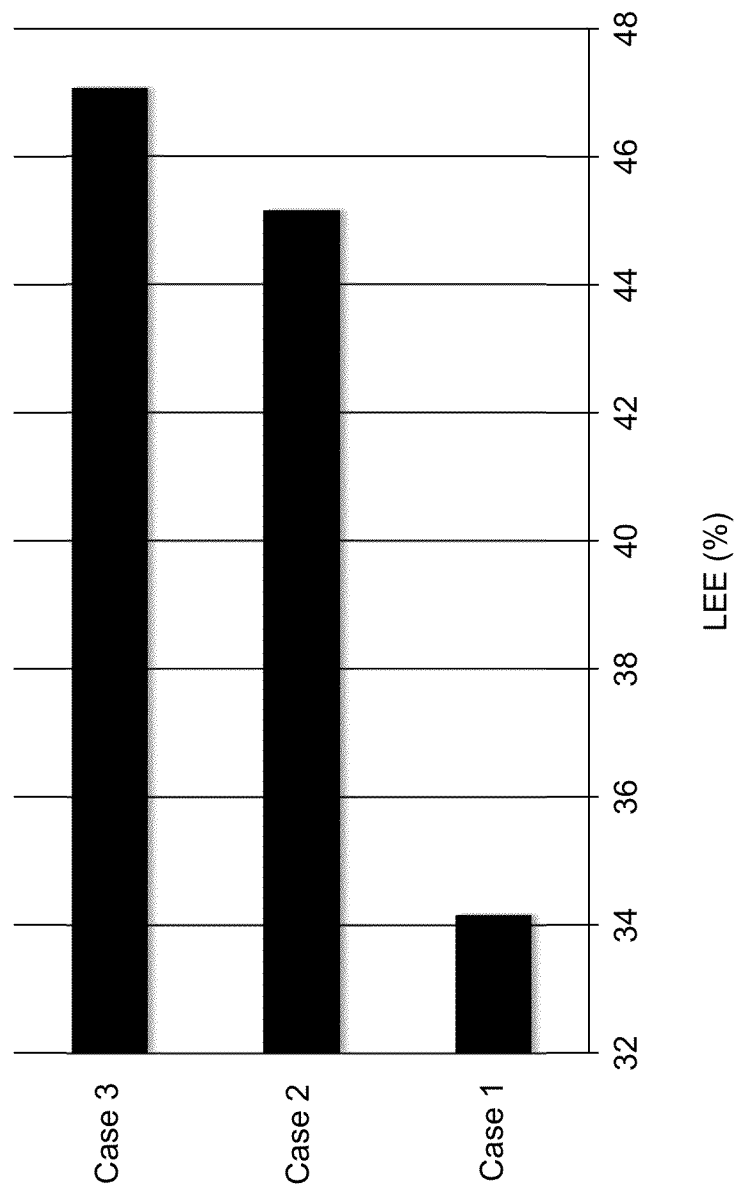
FIG. 12 shows ray tracing calculations of light emitting efficiency (LEE) for different configurations of an illustrative DUV LED according to embodiments.

In an embodiment, the emitting device 510 is configured to operate as a deep ultraviolet LED (DUV LED). FIG. 12 shows ray tracing calculations of light emitting efficiency (LEE) for different configurations of an illustrative DUV LED according to embodiments. In particular, case 1 corresponds to a DUV LED having a p-type metal pad 518A (FIG. 11) with the voids filled with air. Case 2 corresponds to the same configuration of the p-type metal pad 518A, but with the voids filled with silicon dioxide. In this case, the voids can partially scatter light generated by the DUV LED at the p-type contact 544A. Case 3 corresponds to a configuration in which the p-type metal pad 518A includes voids filled with silicon dioxide, while the n-type metal pad 518B (FIG. 11) includes voids filled with air. For the ray tracing calculations, the scattering properties are described by Lambertian scattering with 60% reflective scattering, 20% transmission, and 20% absorption.

Figure 13A:
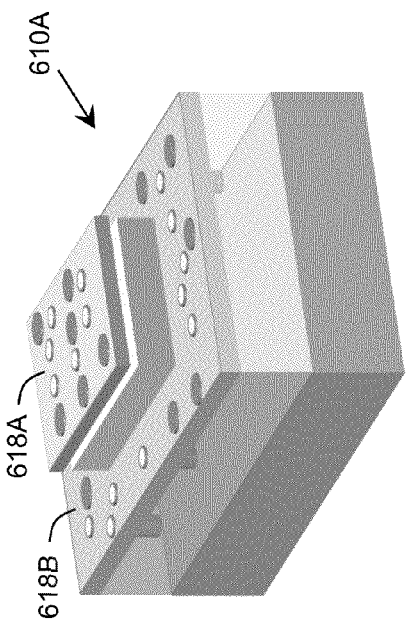
FIGS. 13A-13C show illustrative light emitting diodes according to embodiments.
Figure 13C:
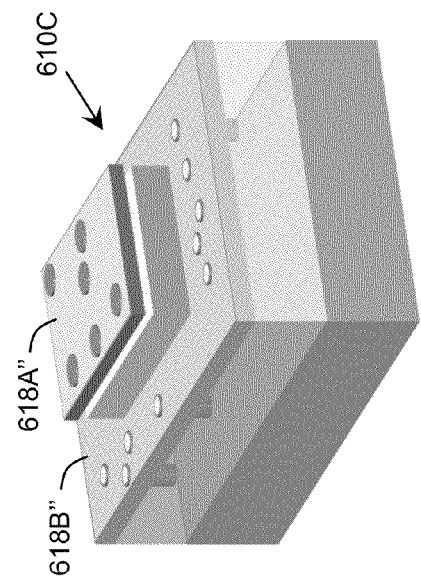
Figure 13B:
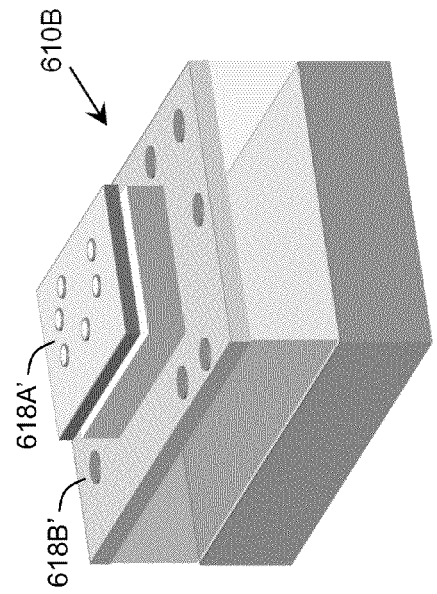

As described herein, an embodiment of an ohmic contact can be utilized as an n-type or a p-type contact in various types of emitting devices. For example, FIGS. 13A-13C show illustrative light emitting diodes 610A-610C according to embodiments. In FIG. 13A, the light emitting diode 610A includes a p-type contact 618A and an n-type contact 618B having a set of recessed protrusions (indicated by light circular areas) and a set of voids (indicated by dark circular areas). However, it is understood that various alternative configurations are possible. For example, in FIG. 13B, the light emitting diode 610B includes a p-type contact 618A' having a set of recessed protrusions, but no voids, and an n-type contact 618B' having a set of voids, but no recessed protrusions. In FIG. 13C, the light emitting diode 610C includes a p-type contact 618A" having a set of voids, but no recessed protrusions, and an n-type contact 618B" having a set of recessed protrusions, but no voids.

Additionally, it is understood that a single contact can include distinct portions, each of which can be configured differently. For example, a contact can include a portion including perforating elements and/or voids and a second portion comprising a regular annealed metallic electrode. In addition, one or more regions of a regular annealed electrode can be recessed into the underlying semiconductor layer(s) thereby forming a large area perforating element. Furthermore, it is understood that a light emitting diode is only illustrative of various types of emitting devices that can include an ohmic contact configured as described herein. For example, illustrative emitting devices include, but are not limited to, a laser diode, a photodiode, and/or the like.

Returning to FIG. 11, in the flip chip configuration for the emitting device 510, the light is emitted through the substrate. To this extent, it is desirable for light to be reflected from the contacts 544A, 544B. However, the p-type contact 544A typically absorbs light. In an embodiment, a coverage area for the p-type contact 544A is selected based on an overall light extraction efficiency (LEE) of the device 510.

Figure 14:
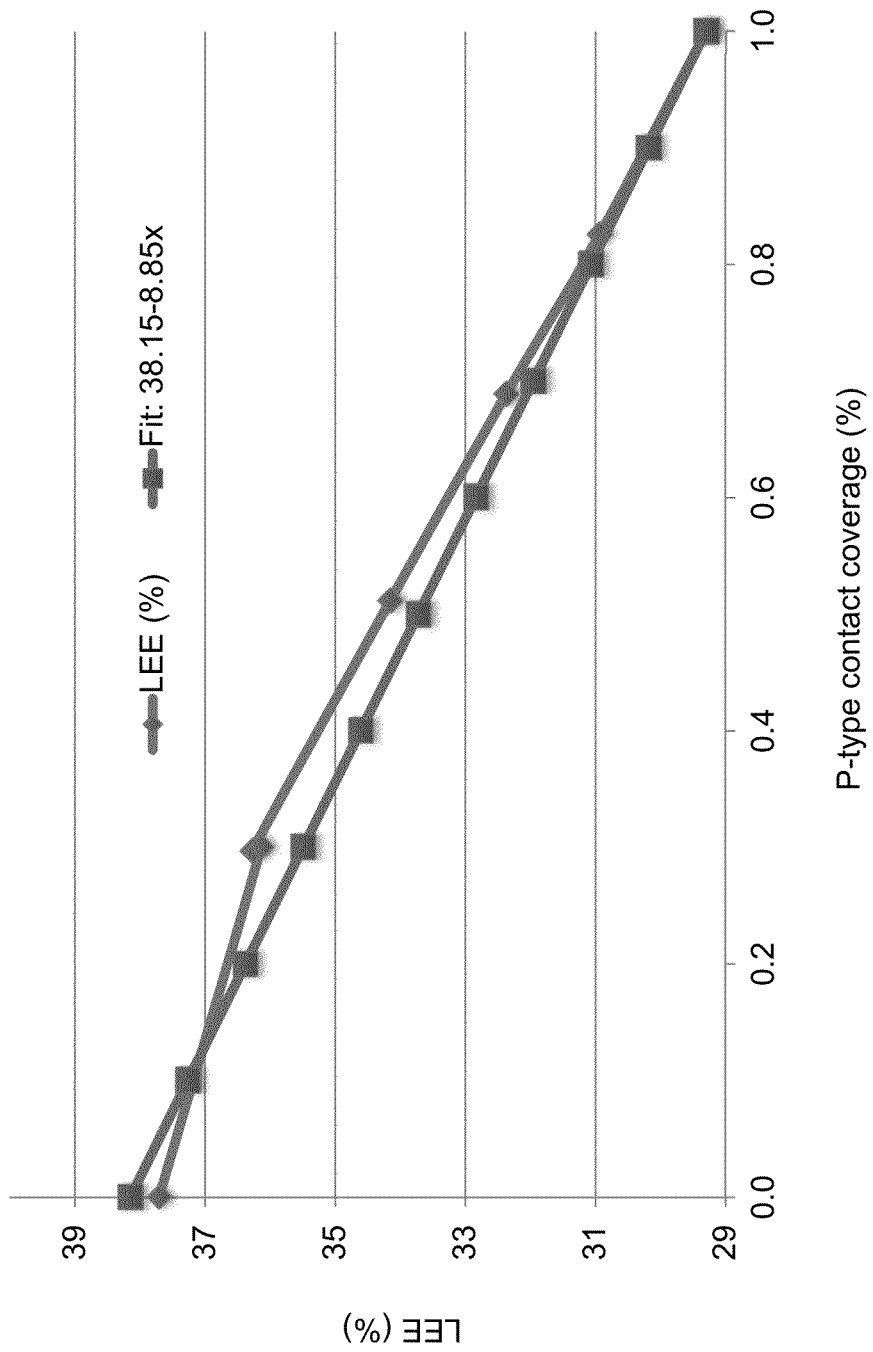
FIG. 14 shows an influence of the p-type contact coverage on LEE for a device according to an embodiment.

For example, FIG. 14 shows an influence of the p-type contact coverage on LEE for a device according to an embodiment. As illustrated, as the contact coverage area decreases, an overall LEE of the device increases. The observed behavior is almost linear, as can be seen from the linear fit also shown in FIG. 14. It is understood that FIG. 14 is only an illustration, as an overall LEE dependence on the p-type contact coverage may change due to, for example, a presence of roughness in the areas not covered by the p-type contact. However, using simulation results, the influence of the coverage area on the LEE maintains a linear dependence even in the presence of roughness, and in general, the LEE increases with a decrease in the contact coverage.

Figure 15:
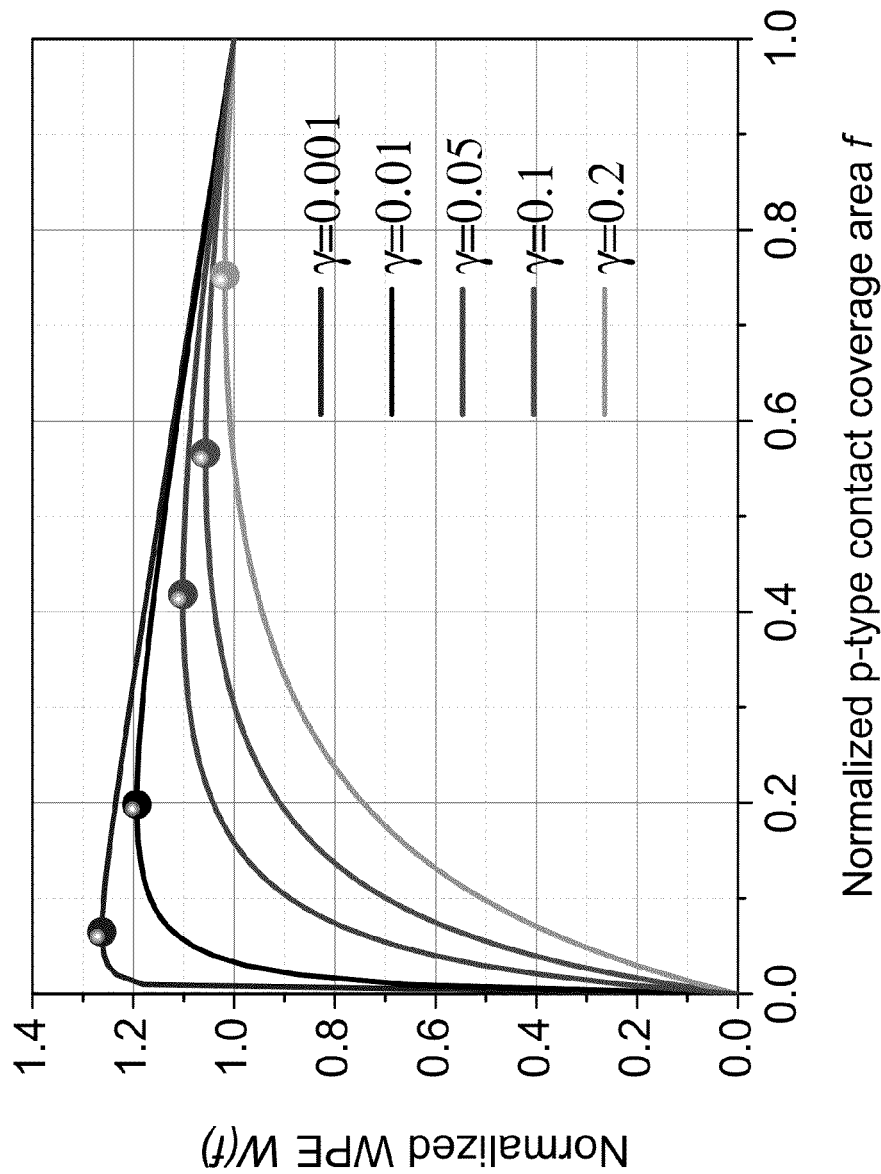
FIG. 15 shows calculated wall plug efficiencies (WPEs) as a function of the p-type contact pad area coverage according to an embodiment.

FIG. 15 shows calculated wall plug efficiencies (WPEs) as a function of the p-type contact pad area coverage according to an embodiment. Consider a device with a resistance, $R_1$, being the resistance of the entire device excluding the contact pad resistance, a resistance, $R_0$, being the contact pad resistance, a normalized contact pad coverage area, f (values of f are in interval of zero to one), and a current, I, being the current in the device. The dissipated power is given by the formula:

$$P_{diss} = I^2 \left( R_1 + \frac{R_0}{f} \right)$$

The LEE can be obtained from the fit derived using FIG. 14, which is given by: LEE=38.15−8.85f. The WPE can be calculated as a function of the normalized contact pad coverage area, WPE=WPE(f). The normalized WPE can be defined as W(f)=WPE(f)/WPE(f=1). For the normalized WPE, we have:

$$W(f) = \frac{LEE(f)}{P_{diss}(f)} \cdot \frac{P_{diss}(f=1)}{LEE(f=1)} = \frac{(1.3 - 0.3f)(1+\gamma)}{1 + \frac{\gamma}{f}}$$

where γ is a ratio of the contact pad to device resistance and is calculated as $\gamma = R_0/R_1$.

As illustrated in FIG. 15, for very small values of γ, e.g., values less than approximately 0.01, the preferred optima is obtained when the contact pad area coverage is small (e.g., less than approximately 0.2), for γ values of around 0.2, and higher, the maximal contact pad area is preferred in order to maximize wall plug efficiency. While the exact location of the peak of WPE depends on a particular set of device parameters, it is clear that there is a possibility for the presence of such peak for devices with contact pad resistance being less than a few tens of percent of the total resistance of the device.

For cases when contact islands are separated by voids, as shown for example in FIG. 10B where the contact islands are circular domains, a size of the gaps between the contact islands can be calculated by requiring that a lateral resistance between the islands be comparable to a vertical resistance of the layer underneath the contact island. Considering, for simplicity, a square contact having a side of a length W, which corresponds to a characteristic contact length scale for the contact, the lateral resistance between two neighboring contacts can be given by R_horizontal=$(\rho_h L)/(Wt)$, where $R_{horizontal}$ is a lateral resistance measured in Ohms, $\rho_h$ is a resistivity in the lateral direction measured in Ohms×meter, L is a characteristic distance between the contacts, and t is the thickness of the semiconductor layer. The vertical resistance underneath the contact is given by: R_vertical=$(\rho_v t)W^2$, where $\rho_v$ is a resistivity in the vertical direction. The characteristic distance between the contacts, L, can be obtained by equating $R_{horizontal}$ with $R_{vertical}$, L=$(\rho_v t)/W^2 \cdot (Wt)/\rho_h$=t$(\rho_v/W)/R_{SH}$=t$\rho_v/(WR_{SH})$, where $R_{SH}$ is a sheet resistance, $R_{SH}=\rho_h/t$. In an embodiment, the characteristic distance L can be found using the formula L=Ct$\rho_v/(WR_{SH})$, where C is a proportionality constant varying from 0.1 to 10. In a more particular embodiment, the proportionality constant C is close to one.

Figure 16:
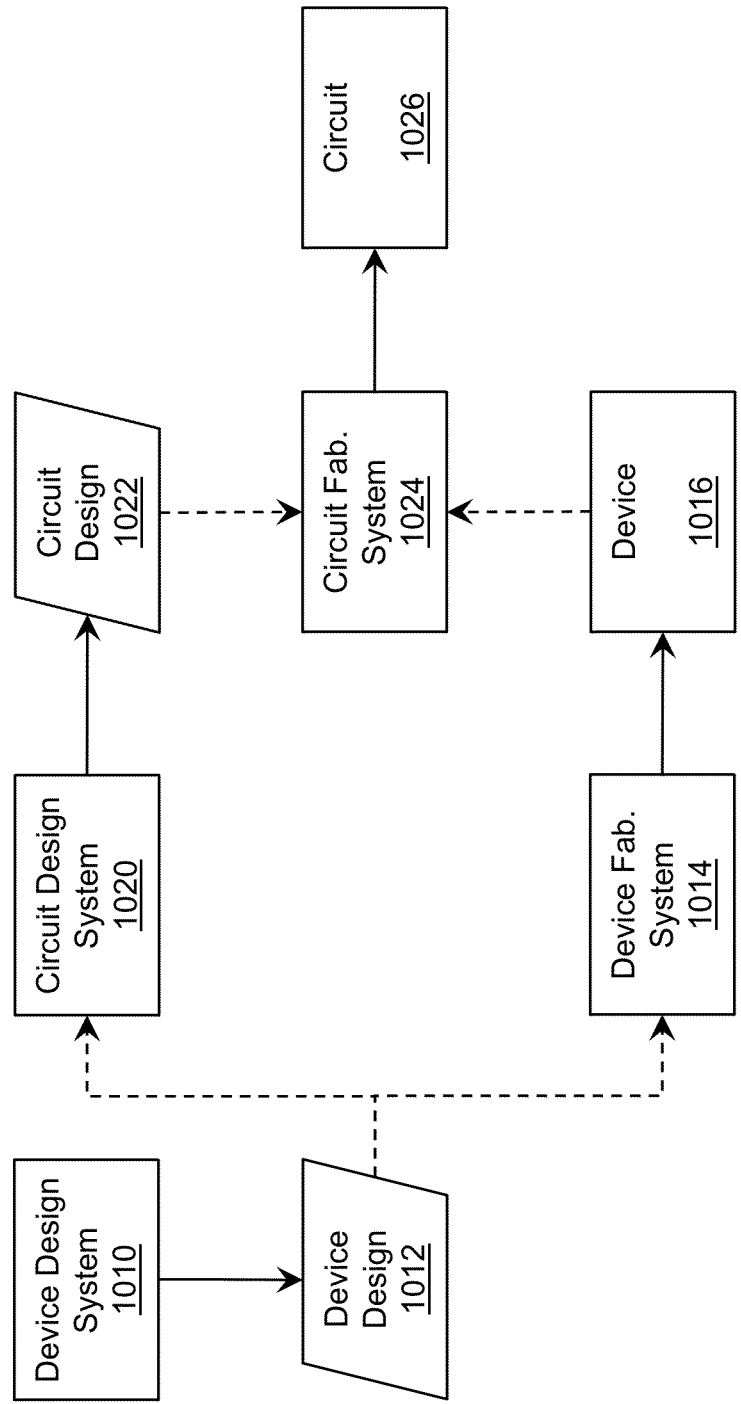
FIG. 16 shows an illustrative flow diagram for fabricating a circuit according to an embodiment.

In an embodiment, the invention provides a method of designing and/or fabricating a circuit that includes one or more of the devices designed and fabricated as described herein. To this extent, FIG. 16 shows an illustrative flow diagram for fabricating a circuit 1026 according to an embodiment. Initially, a user can utilize a device design system 1010 to generate a device design 1012 for a semiconductor device as described herein. The device design 1012 can comprise program code, which can be used by a device fabrication system 1014 to generate a set of physical devices 1016 according to the features defined by the device design 1012. Similarly, the device design 1012 can be provided to a circuit design system 1020 (e.g., as an available component for use in circuits), which a user can utilize to generate a circuit design 1022 (e.g., by connecting one or more inputs and outputs to various devices included in a circuit). The circuit design 1022 can comprise program code that includes a device designed as described herein. In any event, the circuit design 1022 and/or one or more physical devices 1016 can be provided to a circuit fabrication system 1024, which can generate a physical circuit 1026 according to the circuit design 1022. The physical circuit 1026 can include one or more devices 1016 designed as described herein.

In another embodiment, the invention provides a device design system 1010 for designing and/or a device fabrication system 1014 for fabricating a semiconductor device 1016 as described herein. In this case, the system 1010, 1014 can comprise a general purpose computing device, which is programmed to implement a method of designing and/or fabricating the semiconductor device 1016 as described herein. Similarly, an embodiment of the invention provides a circuit design system 1020 for designing and/or a circuit fabrication system 1024 for fabricating a circuit 1026 that includes at least one device 1016 designed and/or fabricated as described herein. In this case, the system 1020, 1024 can comprise a general purpose computing device, which is programmed to implement a method of designing and/or fabricating the circuit 1026 including at least one semiconductor device 1016 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 1010 to generate the device design 1012 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 1010 for designing and/or a device fabrication system 1014 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device comprising:
a light emitting heterostructure semiconductor layer; and
a contact to the light emitting heterostructure semiconductor layer located over the light emitting heterostructure semiconductor layer, wherein the contact includes:
 a semiconductor contact structure adjacent to the light emitting heterostructure semiconductor layer, wherein the semiconductor contact structure comprises a first semiconductor layer that is highly conducting and a second semiconductor layer that is partially insulating; and
 a metal layer including a plurality of contact areas formed of a metal and separated by a set of voids where no metal is located over the semiconductor contact structure, wherein a characteristic distance between the plurality of contact areas is approximately equal to a product of a thickness of the semiconductor contact structure and a vertical resistivity of the semiconductor contact structure divided by a product of a characteristic contact length scale of the contact and a sheet resistance of the semiconductor contact structure.

2. The device of claim 1, wherein at least some of the plurality of contact areas are laterally connected.

3. The device of claim 1, wherein the contact further includes a reflective layer located over the metal layer, wherein the reflective layer comprises material reflective of light emitted by the light emitting heterostructure.

4. The device of claim 1, wherein at least one of the plurality of contact areas includes:
 a plurality of perforating elements, each perforating element comprising a metal deposited in a cavity in the semiconductor contact structure, wherein the plurality of perforating elements are physically separated from each other; and
 a top layer of metal located over an area of the semiconductor contact structure including the plurality of perforating elements.

5. The device of claim 4, wherein at least one of the plurality of perforating elements of the at least one of the plurality of contact areas includes a set of metal protrusions laterally penetrating the semiconductor contact structure.

6. The device of claim 4, wherein at least one void in the set of voids at least partially extends into the second semiconductor layer and a depth of each cavity exceeds at least a thickness of the second semiconductor layer of the semiconductor contact structure.

7. The device of claim 1, wherein a top surface of the second semiconductor layer of the semiconductor contact structure comprises at least one of: a roughness, a patterning, or a light scattering material in at least one of: the set of voids or an area of the second semiconductor layer distinct from a location of the plurality of contact areas.

8. The device of claim 7, wherein the top surface comprises at least one of: the roughness or the patterning, and wherein the at least one of: the roughness or the patterning is located at an interface of the second semiconductor layer of the semiconductor contact structure and one of: an encapsulant or an ambient material.

9. The device of claim 1, further comprising a reflective medium located between the semiconductor contact structure and the plurality of contact areas, wherein the reflective medium has an index of refraction lower than an index of refraction of the second semiconductor layer of the semiconductor contact structure.

10. A device comprising:
a light emitting structure including a semiconductor contact structure, wherein the semiconductor contact structure comprises a first semiconductor layer that is highly conducting and a second semiconductor layer that is partially insulating; and
a metallic contact to the semiconductor contact structure located over the semiconductor contact structure, wherein the metallic contact includes:
 a plurality of contact areas, wherein at least one of the plurality of contact areas includes:
  a plurality of perforating elements, each perforating element comprising a metal deposited in a cavity in the semiconductor contact structure, wherein a depth of the cavity exceeds at least a thickness of the second semiconductor layer of the semiconductor contact structure;
  a top layer of metal located over an area of the semiconductor contact structure including the plurality of perforating elements; and
 a set of voids where no metal is located, wherein at least one of the set of voids is configured based on one of: a reflectivity or a transparency of light emitted by the light emitting structure, and wherein a characteristic distance between the plurality of contact areas is approximately equal to a product of a thickness of the semiconductor contact structure and a vertical resistivity of the semiconductor contact structure divided by a product of a characteristic contact length scale of the contact and a sheet resistance of the semiconductor contact structure.

11. The device of claim 10, wherein the at least one of the set of voids includes a filler material having an index of refraction less than an index of refraction of the second semiconductor layer and greater than an index of refraction of one of: an encapsulant or an ambient material.

12. The device of claim 11, wherein the filler material protrudes from the metal of the plurality of contact areas.

13. The device of claim 10, wherein the device is configured to operate as at least one of: a light emitting diode, a laser diode, or a photodiode.

14. An emitting device, comprising:
a group III nitride-based light emitting heterostructure semiconductor layer; and
a contact to the group III nitride-based light emitting heterostructure semiconductor layer located over the group III nitride-based light emitting heterostructure semiconductor layer, wherein the contact includes:
 a semiconductor contact structure adjacent to the group III nitride-based light emitting heterostructure semiconductor layer, wherein the semiconductor contact structure comprises a first semiconductor layer that is highly conducting and a second semiconductor layer that is partially insulating; and a metal layer including a plurality of contact areas formed of a metal and separated by a set of voids where no metal is located over the semiconductor contact structure, wherein a characteristic distance between the plurality of contact areas is approximately equal to a product of a thickness of the semiconductor contact structure and a vertical resistivity of the semiconductor contact structure divided by a product of a characteristic contact length scale of the contact and a sheet resistance of the semiconductor contact structure.

15. The emitting device of claim 14, wherein the contact further includes a reflective layer located over the metal layer, wherein the reflective layer comprises material reflective of light emitted by the group III nitride-based light emitting heterostructure.

16. The emitting device of claim 14, wherein at least one of the plurality of contact areas includes:

a plurality of perforating elements, each perforating element comprising a metal deposited in a cavity in the semiconductor contact structure, wherein the plurality of perforating elements are physically separated from each other; and a top layer of metal located over an area of the semiconductor contact structure including the plurality of perforating elements.

17. The emitting device of claim 16, wherein at least one of the plurality of perforating elements of the at least one of the plurality of contact areas includes a set of metal protrusions laterally penetrating the semiconductor contact structure.

18. The emitting device of claim 16, wherein at least one void in the set of voids at least partially extends into the second semiconductor layer and a depth of each cavity exceeds at least a thickness of the second semiconductor layer of the semiconductor contact structure.

19. The emitting device of claim 14, wherein a top surface of the second semiconductor layer of the semiconductor contact structure comprises at least one of: a roughness, a patterning, or a light scattering material in at least one of: the set of voids or an area of the second semiconductor layer distinct from a location of the plurality of contact areas.

20. The emitting device of claim 14, further comprising a reflective medium located between the semiconductor contact structure and the plurality of contact areas, wherein the reflective medium has an index of refraction lower than an index of refraction of the second semiconductor layer of the semiconductor contact structure.

* * * * *